(12) United States Patent
Lee et al.

(10) Patent No.: US 12,550,602 B2
(45) Date of Patent: Feb. 10, 2026

(54) STRETCHABLE PANEL AND ELECTRONIC DEVICE

(71) Applicant: Samsung Electronics Co., Ltd., Suwon-si (KR)

(72) Inventors: Gae Hwang Lee, Suwon-si (KR); Hyun Bum Kang, Suwon-si (KR); Youngjun Yun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 347 days.

(21) Appl. No.: 18/188,872

(22) Filed: Mar. 23, 2023

(65) Prior Publication Data

US 2023/0422593 A1     Dec. 28, 2023

(30) Foreign Application Priority Data

Jun. 28, 2022  (KR) ........................ 10-2022-0078938

(51) Int. Cl.
*H10K 77/10*     (2023.01)
*H10K 59/121*    (2023.01)
*H10K 102/00*    (2023.01)

(52) U.S. Cl.
CPC ....... *H10K 77/111* (2023.02); *H10K 59/1213* (2023.02); *H10K 59/1216* (2023.02); *H10K 2102/311* (2023.02)

(58) Field of Classification Search
CPC ............. H10K 77/111; H10K 59/1213; H10K 59/1216; H10K 2102/311; H10K 59/131;
(Continued)

(56) References Cited

U.S. PATENT DOCUMENTS 10,923,670 B2 * 2/2021 Yoo ..................... H10K 77/111
10,964,234 B2    3/2021 Kim et al.
(Continued)

FOREIGN PATENT DOCUMENTS

EP     3951901 A1    2/2022
KR   2019-0132745 A   11/2019
(Continued)

OTHER PUBLICATIONS

Extended European Search Report dated Nov. 8, 2023 for corresponding European Application No. 23181166.2.
(Continued)

*Primary Examiner* — J.E. Schoenholtz
(74) *Attorney, Agent, or Firm* — HARNESS, DICKEY & PIERCE, P.L.C.

(57) ABSTRACT

A stretchable panel includes a stretchable substrate including a first elastomer having a first elastic modulus, a non-stretchable pattern covering a portion of the stretchable substrate and including a particular material that includes an organic, inorganic, or organic-inorganic material, the particular material having a second elastic modulus higher than the first elastic modulus, a plurality of unit elements arranged on the non-stretchable pattern, a plurality of pixel circuits configured to independently operate separate, respective unit elements, a connection electrode configured to electrically connect each of the unit elements and each of the pixel circuits, and an elastic structure overlapped with an edge portion of the non-stretchable pattern along a thickness direction of the stretchable substrate and comprising a second elastomer having a third elastic modulus higher than the first elastic modulus and lower than the second elastic modulus, and an electronic device including the same.

18 Claims, 18 Drawing Sheets

(58) Field of Classification Search
CPC ...... H10K 59/12; H10K 59/123; H10K 59/80; H10K 50/805; H10K 50/844; Y02E 10/549; G09F 9/301; G09F 9/33; H10H 29/142; H10D 30/6755
See application file for complete search history.

(56) References Cited

U.S. PATENT DOCUMENTS

| | | |
|---|---|---|
| 11,271,179 B2 | 3/2022 | Kim et al. |
| 11,502,069 B2 | 11/2022 | Jung et al. |
| 2020/0028102 A1 | 1/2020 | Kim et al. |
| 2020/0111390 A1* | 4/2020 | Kim ................. G09F 9/301 |
| 2020/0410906 A1 | 12/2020 | Chen |
| 2021/0066266 A1 | 3/2021 | Jung et al. |
| 2021/0097902 A1 | 4/2021 | Hong et al. |
| 2021/0313527 A1 | 10/2021 | Hong et al. |
| 2022/0101760 A1 | 3/2022 | Lee et al. |

FOREIGN PATENT DOCUMENTS

| | | |
|---|---|---|
| KR | 2020-0009899 A | 1/2020 |
| KR | 10-2020-0039973 A | 4/2020 |
| KR | 2021-0025417 A | 3/2021 |
| WO | WO-2016/144356 A1 | 9/2016 |

OTHER PUBLICATIONS

Korean Office Action dated Dec. 18, 2025 for corresponding Korean Patent Application No. 10-2022-0078938 and its English-language translation herein.

\* cited by examiner

STRETCHABLE PANEL AND ELECTRONIC DEVICE

CROSS-REFERENCE TO RELATED APPLICATION

This application claims priority to and the benefit of Korean Patent Application No. 10-2022-0078938 filed in the Korean Intellectual Property Office on Jun. 28, 2022, the entire contents of which are incorporated herein by reference.

BACKGROUND

1. Field

A stretchable panel and an electronic device are related.

2. Description of the Related Art

In recent years, research on a stretchable panel such as a display panel that can be curved, bent, or folded or a wearable sensor array that can be attached to a living body or an object is in progress. Such a stretchable panel may be required to have stretchability of being stretched or restored according to motions of the living body or shapes of the object as well as the flexibility of be curved, bent, or folded in a particular (or, alternatively, predetermined) direction.

SUMMARY

The stretchable panel may have flexibility and stretchability as described above, but stress may be concentrated in a specific region during stretching, and structural and functional deformation and damage may occur in the specific region where such stress is concentrated.

Some example embodiments provide a stretchable panel that can have high stretch stability by reducing structural and functional deformation and damage in an area where stress is concentrated while securing flexibility and stretchability.

Some example embodiments provide an electronic device including the stretchable panel.

According to some example embodiments, a stretchable panel includes a stretchable substrate including a first elastomer having a first elastic modulus, a non-stretchable pattern covering a portion of the stretchable substrate and including a particular material that includes an organic, inorganic, or organic-inorganic material, the particular material having a second elastic modulus higher than the first elastic modulus, a plurality of unit elements arranged on the non-stretchable pattern, a plurality of pixel circuits configured to independently operate separate, respective unit elements of the plurality of unit elements, a connection electrode configured to electrically connect each unit element of the plurality of unit elements and each pixel circuit of the plurality of pixel circuits, and an elastic structure overlapped with an edge portion of the non-stretchable pattern along a thickness direction of the stretchable substrate and including a second elastomer having a third elastic modulus higher than the first elastic modulus and lower than the second elastic modulus.

The stretchable panel may include a non-stretchable region in which the stretchable substrate and the non-stretchable pattern are overlapped along the thickness direction of the stretchable substrate, and a stretchable region excluding the non-stretchable region, and at least a portion of the plurality of pixel circuits may be in the stretchable region.

Each pixel circuit of the plurality of pixel circuits may be configured to operate a separate unit element of the plurality of unit elements and comprises a first pixel circuit and a second pixel circuit, the first pixel circuit may be in the non-stretchable region, the second pixel circuit may be in the stretchable region, and the connection electrode may be configured to electrically connect the first pixel circuit and the second pixel circuit or electrically connect the separate unit element and the second pixel circuit.

The first pixel circuit may include a non-stretchable thin film transistor, a capacitor, or a combination thereof, and the second pixel circuit may include a stretchable thin film transistor.

The first pixel circuit may include a driving thin film transistor, and the second pixel circuit may include a switching thin film transistor.

The connection electrode may be overlapped with the edge portion of the non-stretchable pattern and the elastic structure along the thickness direction of the stretchable substrate, respectively.

The elastic structure may be disposed under the stretchable substrate, inside the stretchable substrate, on the non-stretchable pattern, or between the stretchable substrate and the non-stretchable pattern.

The elastic structure may be overlapped with each unit element of the plurality of unit elements along the thickness direction of the stretchable substrate, and a dimension of the elastic structure is greater than a dimension of each unit element of the plurality of unit elements.

Each unit element of the plurality of unit elements may include a light emitting diode, a photoelectric conversion diode, or a combination thereof.

The non-stretchable pattern may include a plurality of island-shaped non-stretchable patterns repeatedly arranged on the stretchable substrate and in which the plurality of unit elements are disposed, and a plurality of linear non-stretchable patterns connecting between adjacent island-shaped non-stretchable patterns of the plurality of island-shaped non-stretchable patterns.

The stretchable panel may further include a wire electrically connected to at least one pixel circuit of the plurality of pixel circuits or at least one unit element of the plurality of unit elements and the wire may be on the plurality of linear non-stretchable patterns.

According to some example embodiments, in the stretchable panel that is foldable, bendable, or rollable along at least one axis extending in a first direction may include a deformable section that is foldable, bendable, or rollable along the axis, and a non-deformable section excluding the deformable section. The deformable section may include a stretchable substrate including a first elastomer having a first elastic modulus, a non-stretchable pattern covering a portion of the stretchable substrate, the non-stretchable pattern comprising a particular material that includes an organic, inorganic, or organic-inorganic material, the particular material having a second elastic modulus higher than the first elastic modulus, a plurality of unit elements arranged on the non-stretchable pattern, a plurality of pixel circuits configured to independently operate separate, respective unit elements of the plurality of unit elements, a connection electrode configured to electrically connect each unit element of the plurality of unit elements and each pixel electrode of the plurality of pixel circuits, and an elastic structure overlapped with an edge portion of the non-stretchable pattern along a thickness direction of the stretchable substrate and including a second elastomer having a third elastic modulus higher than the first elastic modulus and lower than the second elastic modulus.

The deformable section of the stretchable panel may include a non-stretchable region in which the stretchable substrate and the non-stretchable pattern are overlapped along the thickness direction of the stretchable substrate, and a portion of the plurality of pixel circuits may be disposed on the stretchable region.

Each pixel circuit of the plurality of pixel circuits may be configured to operate a separate unit element of the plurality of unit elements and pixel circuit of the plurality of pixel circuits may include a first pixel circuit in the non-stretchable region and including a non-stretchable thin film transistor, a capacitor, or a combination thereof, and a second pixel circuit in the stretchable region and including a stretchable thin film transistor, and each unit element of the plurality of unit elements comprises a light emitting diode, a photoelectric conversion diode, or a combination thereof.

The elastic structure may be under the stretchable substrate, inside the stretchable substrate, on the non-stretchable pattern, or between the stretchable substrate and the non-stretchable pattern.

The non-stretchable pattern may include a plurality of island-shaped non-stretchable patterns which are repeatedly disposed on the stretchable substrate in the deformable section and in which the plurality of unit elements are disposed, a plurality of linear non-stretchable patterns which connect between adjacent island-shaped non-stretchable patterns of the plurality of island-shaped non-stretchable patterns in the deformable section and on which wires electrically connected to the plurality of pixel circuits or the plurality of unit elements are disposed, and a plate-shaped non-stretchable pattern located entirely within the non-deformable section.

According to some example embodiments, a stretchable panel may include a plurality of unit elements including a light emitting diode, a photoelectric conversion diode, or a combination thereof, a switching thin film transistor and a driving thin film transistor configured to independently operate each unit element of the plurality of unit elements, a plurality of island-shaped non-stretchable patterns, the plurality of island-shaped non-stretchable patterns supporting each unit element of the plurality of unit elements, a plurality of linear non-stretchable patterns connecting between adjacent island-shaped non-stretchable patterns of the plurality of island-shaped non-stretchable patterns and on which wires electrically connected to the plurality of unit elements are located, a stretchable substrate supporting the plurality of island-shaped non-stretchable patterns and the plurality of linear non-stretchable patterns, and an elastic structure disposed on, under, or inside the stretchable substrate and overlapped with an edge portion of the plurality of island-shaped non-stretchable patterns along a thickness direction of the stretchable substrate, wherein the stretchable substrate includes a first elastomer having a first elastic modulus, the plurality of island-shaped non-stretchable patterns include a particular material that includes an organic material, an inorganic material, an organic-inorganic material, or a combination thereof, the particular material having a second elastic modulus higher than the first elastic modulus, and the elastic structure includes a second elastomer having a third elastic modulus higher than the first elastic modulus and lower than the second elastic modulus.

The stretchable panel may include a non-stretchable region in which the stretchable substrate is overlapped with the plurality of island-shaped non-stretchable patterns or the linear non-stretchable patterns along the thickness direction of the stretchable substrate and a stretchable region excluding the non-stretchable region, and at least a portion of the switching thin film transistor and the driving thin film transistor may be in the stretchable region.

One of the switching thin film transistor or the driving thin film transistor may be disposed in the stretchable region, another one of the switching thin film transistor or the driving thin film transistor may be in the non-stretchable region, the stretchable panel may further include a connection electrode electrically connecting the switching thin film transistor and the driving thin film transistor, and the connection electrode may be overlapped with the edge portion of the plurality of island-shaped non-stretchable patterns and the elastic structure along the thickness direction of the stretchable substrate, respectively.

According to some example embodiments, an electronic device including the stretchable panel is provided.

Stretch stability of the stretchable panel may be improved based on reducing structural and functional deformation and damage in areas where stress is concentrated while securing flexibility and stretchability of the stretchable panel.

DETAILED DESCRIPTION

Figure 1:
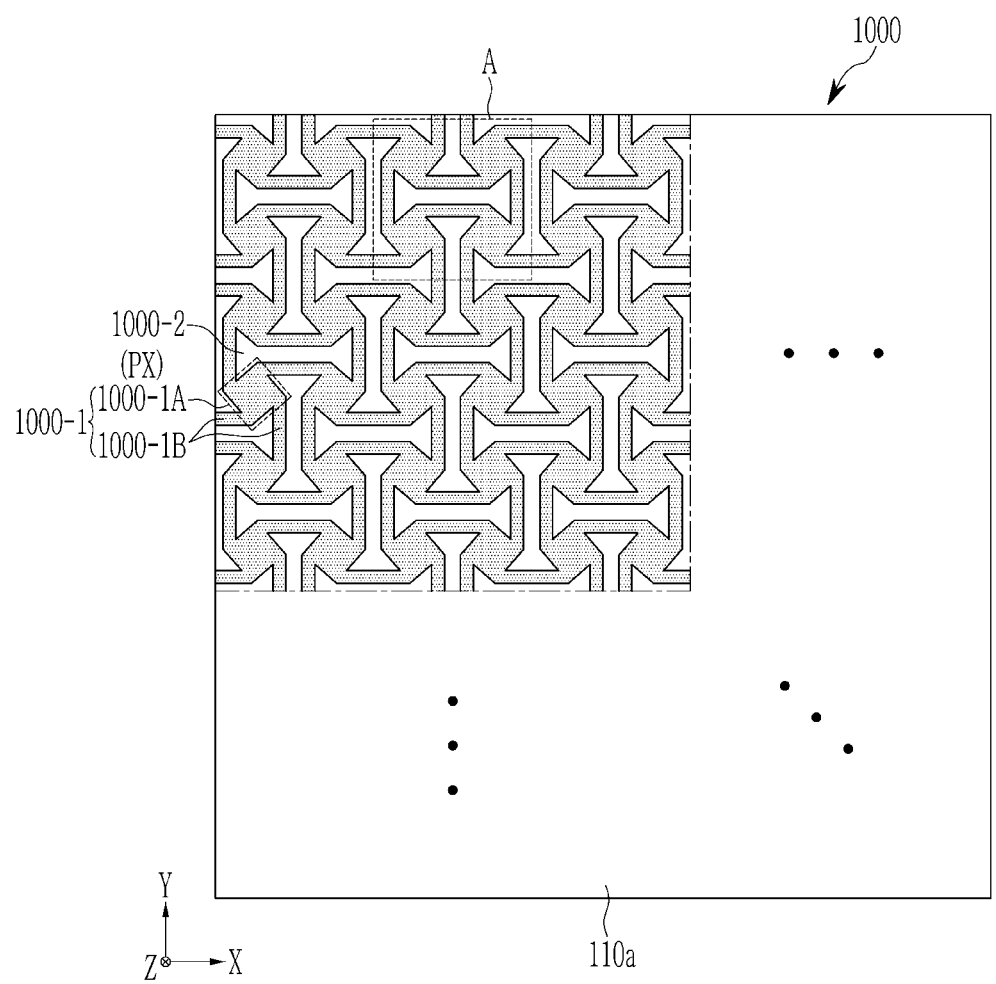
FIG. 1 is a plan view schematically showing an example of a stretchable panel according to some example embodiments.

Hereinafter, some example embodiments will be described in detail so that those of ordinary skill in the art can easily implement them. However, the actually applied structure may be implemented in several different forms and is not limited to the example embodiments described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, when a definition is not otherwise provided, "substituted" refers to replacement of hydrogen of a compound or a functional group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, C7 to C30 arylalkyl group, C1 to C30 alkoxy group, a C1 to C20 heteroalkyl group, a C3 to C20 heteroaryl group, C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, "polymer" includes a homopolymer, a copolymer, or a combination thereof.

Hereinafter, "combination" includes a mixture, a composite, or a stacked structure of two or more.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Hereinafter, a stretchable panel according to some example embodiments will be described with reference to the drawings.

A stretchable panel according to some example embodiments may include all panels in which an element array including a plurality of unit elements operating in an active matrix manner is arranged on a substrate deformable by an external force. For example, the stretchable panel may include a flexible display panel, a stretchable display panel, a flexible sensor array panel, a stretchable sensor array panel, or a combination thereof, having flexible and/or stretchable characteristics.

Figure 2:
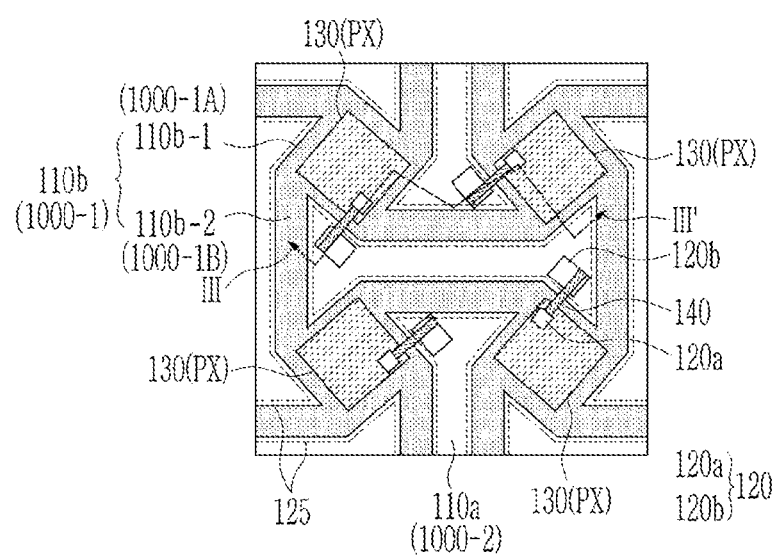
FIG. 2 is a plan view according to an example showing an enlarged portion "A" of FIG. 1 according to some example embodiments.
Figure 3:
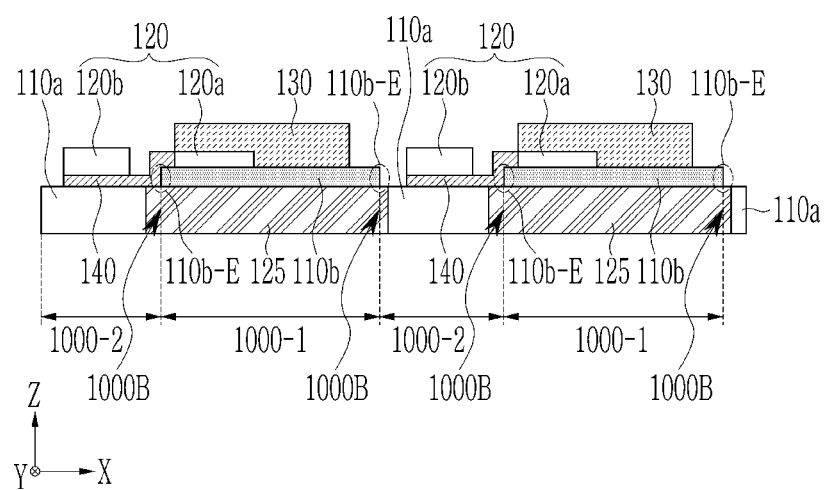
FIG. 3 is a cross-sectional view according to an example of the stretchable panel along cross-sectional view line III-III' of FIG. 2 according to some example embodiments.
Figure 4:
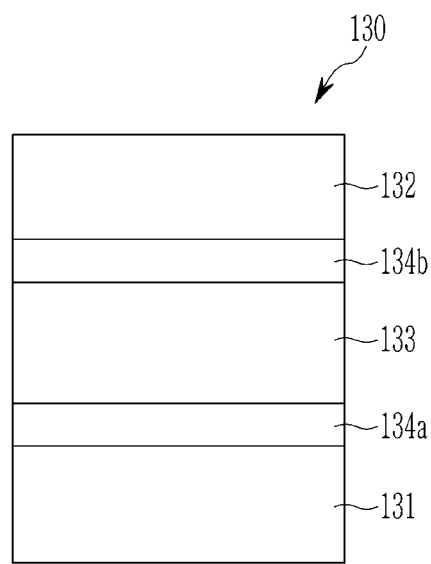
FIG. 4 is a cross-sectional view schematically showing an example of a unit element in the stretchable panel of FIGS. 1 to 3 according to some example embodiments.

FIG. 1 is a plan view schematically showing an example of a stretchable panel according to some example embodiments, FIG. 2 is a plan view according to an example showing an enlarged portion "A" of FIG. 1 according to some example embodiments, FIG. 3 is a cross-sectional view according to an example of the stretchable panel along cross-sectional view line III-III' of FIG. 2 according to some example embodiments, and FIG. 4 is a cross-sectional view schematically showing an example of a unit element in the stretchable panel of FIGS. 1 to 3.

Referring to FIGS. 1 and 2, a stretchable panel 1000 according to some example embodiments includes regions having different elastic moduli along an in-plane direction (e.g., XY direction) of the stretchable substrate 110a, and the regions may include a non-stretchable region 1000-1 having a relatively high elastic modulus and a stretchable region 1000-2 having a relatively low elastic modulus.

The non-stretchable region 1000-1 may be a region in which resistance to external force such as twisting, pressing and/or pulling is relatively high, so that it may not be substantially deformed or a deformation degree is very small by the external force. The non-stretchable region 1000-1 may include non-stretchable pattern 110b. While example embodiments of the stretchable panel 1000 are described herein to include a non-stretchable pattern 110b, it will be understood that the non-stretchable pattern 110b may include multiple non-stretchable patterns, and in some example embodiments a stretchable panel 1000 may include multiple non-stretchable patterns 110b. The non-stretchable pattern 110b may include a particular material that includes an organic, inorganic, or organic-inorganic material, the particular material having a high elastic modulus. The non-stretchable region 1000-1 may be a region in which the non-stretchable pattern 110b having the high elastic modulus are covered on the stretchable substrate 110a (e.g., covering a portion of the stretchable substrate 110a, including a limited portion of an area of the stretchable substrate 110a) as will be described later. Accordingly, the non-stretchable region 1000-1 may have substantially the same planar shape as the non-stretchable pattern 110b. The elastic modulus of the non-stretchable region 1000-1 may be determined by (e.g., may be based on) the elastic modulus of the non-stretchable pattern 110b, and even when the stretchable substrate 110a is stretched in a particular (or, alternatively, predetermined) direction, the non-stretchable region 1000-1 may not be substantially stretched or deformed (e.g., may remain rigid) due to the high elastic modulus of the non-stretchable pattern 110b-1.

The non-stretchable region 1000-1, including the non-stretchable pattern 110b, may include a plurality of island-shaped non-stretchable regions 1000-1A having a particular (or, alternatively, predetermined) width and a linear non-stretchable region 1000-1B connecting adjacent island-shaped non-stretchable regions 1000-1A of the plurality of island-shaped non-stretchable regions 1000-1A.

The plurality of island-shaped non-stretchable regions 1000-1A may be an area occupied by a plurality of pixels PXs of the stretchable panel 1000, and each of the island-shaped non-stretchable regions 1000-1A may include a separate unit element 130 to be described later and a portion of a separate pixel circuit 120 configured to operate the separate unit element 130. The plurality of pixels PXs may be repeatedly arranged along rows and/or columns, and accordingly, the plurality of island-shaped non-stretchable regions 1000-1A may also be repeatedly arranged along rows and/or columns. Each pixel PX may include a plurality of subpixels, and the plurality of subpixels included in each pixel PX may have an arrangement such as 3×1, 2×2, 3×3, or 4×4, but example embodiments are not limited thereto. The arrangement of the plurality of pixels PXs (or subpixels) may be the same as that of the unit element 130 to be described later, and may be, for example, a Bayer matrix, a PenTile matrix, and/or a diamond matrix, but is not limited thereto. In the following description, a pixel and a subpixel may be used interchangeably.

The linear non-stretchable region 1000-1B may be a region in which wires of the stretchable panel 1000 are disposed, and the wires may be, for example, a gate line, a data line, and/or a driving voltage line, but are not limited thereto. The arrangement of the plurality of island-shaped non-stretchable regions 1000-1A and the linear non-stretchable region 1000-1B may be variously modified according to the arrangement of a plurality of pixels and the arrangement of wires, but it may be arranged in a geometric pattern so that a three-dimensional deformation may occur, when the stretchable substrate 110a is stretched.

The stretchable region 1000-2 is a region capable of flexibly responding to an external force such as twisting, pressing and/or pulling, and may be a region excluding the non-stretchable region 1000-1. The stretchable region 1000-2 may be a region in which the non-stretchable pattern 110b is not covered on the stretchable substrate 110a and may be relatively evenly or uniformly disposed in the whole of the stretchable panel 1000. Restated, the stretchable region 1000-2 may include and/or may be defined by a particular portion of the stretchable substrate 110a that is exposed from the one or more non-stretchable patterns in a thickness direction of the stretchable substrate 110a (e.g., the Z direction as shown). The elastic modulus of the stretchable region 1000-2 may be substantially the same as the elastic modulus of the stretchable substrate 110a. The stretchable region 1000-2 may be isolated by being surrounded (e.g., in the in-plane direction, for example in the XY direction) by for example, the non-stretchable region 1000-1, but example embodiments are not limited thereto. For example, the non-stretchable region 1000-1 may be surrounded and isolated (e.g., in the XY direction) by the stretchable region 1000-2. A portion of the pixel circuit 120 of each pixel PX may be disposed (e.g., located) in the stretchable region 1000-2, as will be described later. A boundary 1000B between the non-stretchable region 1000-1 and the stretchable region 1000-2 may be an edge portion 110b-E of the non-stretchable pattern 110b. As shown, the boundary 1000B may include multiple, separate boundaries 10001B defined by separate edge portions 110b-E.

Referring to FIGS. 2 and 3, the stretchable panel 1000 according to some example embodiments includes a stretchable substrate 110a, a non-stretchable pattern 110b covering a portion of the stretchable substrate 110a (e.g., overlapping a portion of the stretchable substrate 110a along a thickness direction of the stretchable substrate 110a), a pixel circuit 120, a unit element 130, a connection electrode 140, and an elastic structure 125. As described herein, the pixel circuit 120 may include a plurality of pixel circuits 120, the unit element 130 may include a plurality of unit elements 130, where the plurality of pixel circuits 120 are configured to independently operate separate, respective unit elements 130 of the plurality of unit elements 130, and the connection electrode 140 may include a plurality of connection electrodes 140 that are configured to electrically connect separate, respective unit elements 130 of the plurality of unit elements 130 and separate, respective pixel circuits 120 of the plurality of pixel circuits 120. As described herein, the elastic structure 125 may include a single elastic structure 125 or a plurality of separate elastic structures 125.

The stretchable substrate 110a may have a particular (or, alternatively, predetermined) stretchability, and may include an elastomer (hereinafter referred to as a "first elastomer") capable of flexibly responding to an external force such as twisting, pressing, and/or pulling. The first elastomer may include an elastomer (including an organic/inorganic elastomer), an inorganic elastomer-like material, or a combination thereof, where the first elastomer may have a relatively low elastic modulus (hereinafter referred to as a "first elastic modulus"). The first elastomer may include, for example, polyorganosiloxane, a polymer including a butadiene moiety, a polymer including a urethane moiety, a polymer including an acrylic moiety, a polymer including an olefin moiety, or a combination thereof, and may be for example polydimethylsiloxane (PDMS), thermoplastic polyurethane (TPU), styrene-ethylene-butylene-styrene (SEBS), styrene-ethylene-propylene-styrene (SEPS), styrene-butadiene-styrene (SBS), styrene-isoprene-styrene (SIS), styrene-isobutyrene-styrene (SIBS), or a combination thereof, but is not limited thereto. The inorganic elastomer-like material may include, for example, a ceramic having elasticity, a solid metal having elasticity, a liquid metal having elasticity, or a combination thereof, but not limited to.

The non-stretchable pattern 110b may be disposed on (e.g., directly on or indirectly on) the stretchable substrate 110a and cover (e.g., overlap along the thickness direction of the stretchable substrate 110a extending in the Z direction) a portion (e.g., a limited portion) of the stretchable substrate 110a (e.g., exposing a separate portion of the stretchable substrate 110a along the thickness direction of the stretchable substrate 110a). The non-stretchable pattern 110b may define the non-stretchable region 1000-1 of FIG. 1. For example, the stretchable substrate 110a covered with the non-stretchable pattern 110b (e.g., overlapped with the non-stretchable pattern 110b along the thickness direction of the stretchable substrate 110a extending in the Z direction) may be the non-stretchable region 1000-1 and the stretchable substrate 110a not covered with the non-stretchable pattern 110b (e.g., not overlapped with, or exposed from, the non-stretchable pattern 110b along the thickness direction of the stretchable substrate 110a extending in the Z direction) may be the stretchable region 1000-2.

The non-stretchable pattern 110b may include a particular material that may include organic materials, inorganic materials, organic materials, or a combination thereof. The particular material may have a high elastic modulus (hereinafter referred to as a "second elastic modulus") capable of exhibiting relatively high resistance to external forces such as twisting, pressing, and/or pulling. For example, the second elastic modulus may be at least about $10^2$ times higher than the first elastic modulus, and may be, for example, about $10^2$ to about $10^6$ times higher within this range. For example, the non-stretchable pattern 110b may include a particular material that is an organic material having a relatively high elastic modulus, for example, polycarbonate, polymethyl methacrylate, polyethylene terephthalate, polyethylene naphthalate, polyimide, polyamide, polyamideimide, polyethersulfone, or a combination thereof, but is not limited thereto.

The non-stretchable pattern 110b may be formed by, for example, coating or depositing a material (e.g., an organic material) having the second elastic modulus on the stretchable substrate 110a to form a layer, and partially removing the layer by etching to leave the non-stretchable pattern 110b in a portion corresponding to the non-stretchable region 1000-1. However, the present inventive concepts are not limited thereto, and the non-stretchable region 1000-1 and the stretchable region 1000-2 having different elastic moduli may be implemented by forming the non-stretchable pattern 110b on the stretchable substrate 110a in various ways.

The non-stretchable pattern 110b may include a plurality of island-shaped non-stretchable patterns 110b-1 repeatedly disposed on the stretchable substrate 110a and a plurality of linear non-stretchable patterns 110b-2 connecting adjacent island-shaped non-stretchable patterns 110b-1 of the plurality of island-shaped non-stretchable patterns 110b-2. The plurality of island-shaped non-stretchable patterns 110b-1 may correspond to the aforementioned plurality of island-shaped non-stretchable regions 1000-1A, and the plurality of linear non-stretchable patterns 110*b*-2 may correspond to the aforementioned plurality of linear non-stretchable regions 1000-1B. Since each unit element 130 of the unit elements 130 to be described later may be disposed in each of (e.g., a separate one of) the island-shaped non-stretchable patterns 110*b*-1, a dimension (for example, size or area) of each of the island-shaped non-stretchable patterns 110*b*-1 may be larger than a dimension of each of the unit elements 130. Wires to be described later may be disposed in each of the linear non-stretchable patterns 110*b*-2, and a width of each of the linear non-stretchable patterns 110*b*-2 may be wider than a width of each wire.

The pixel circuits 120 may be repeatedly arranged on the stretchable substrate 110*a* and may be independently control and/or operate each pixel (or subpixel) PX by being arranged around each pixel PX. For example, each separate pixel circuit 120 may be configured to operate a separate unit element 130. The pixel circuits 120 may include elements necessary to independently control and/or operate each pixel (or subpixel), and may include, for example, a plurality of thin film transistors (TFTs) and capacitors.

The plurality of thin film transistors may be electrically connected to one or more wires, and the wires may include a gate line transmitting a gate signal (or a scan signal), a data line transmitting a data signal, and/or a driving voltage line transmitting a driving voltage. At least a portion of the plurality of wires may be stretchable wires. The plurality of thin film transistors may include at least one switching thin film transistor (switching TFT) and at least one driving thin film transistor (driving TFT).

Each pixel circuit 120 of the pixel circuits 120 may include a first pixel circuit 120*a* and a second pixel circuit 120*b* that are disposed in the center of one pixel PX and are separated from each other but are electrically connected to each other. At least a portion of the first pixel circuit 120*a* and the second pixel circuit 120*b* may be disposed in the stretchable region 1000-2.

For example, the first pixel circuit 120*a* may be disposed in the non-stretchable region 1000-1 that is formed on the non-stretchable pattern 110*b* and the second pixel circuit 120*b* may be formed on the stretchable substrate 110*a* on which the non-stretchable pattern 110*b* is not formed and may be disposed in the stretchable region 1000-2. For example, the first pixel circuit 120*a* may include a non-stretchable thin film transistor (non-stretchable TFT) and a capacitor, and the second pixel circuit 120*b* may include a stretchable thin film transistor (stretchable TFT).

The non-stretchable thin film transistor may include a non-stretchable semiconductor layer as an active layer. The non-stretchable semiconductor layer may include an inorganic semiconductor layer and may include, for example, silicon, an oxide semiconductor, or a combination thereof. The stretchable thin film transistor may include a stretchable semiconductor layer as an active layer. The stretchable semiconductor layer may include, for example, an organic semiconductor, and may include, for example, a low molecular semiconductor, a polymer semiconductor, or a combination thereof. The stretchable semiconductor layer may include, for example, a semiconductor material and optionally an elastomer. The semiconductor material may include, for example, an organic semiconductor, an oxide semiconductor, or a combination thereof, and the elastomer may include, for example, polydimethylsiloxane (PDMS), styrene-ethylene-butylene-styrene (SEBS), styrene-ethylene-propylene-styrene (SEPS), styrene-butadiene-styrene (SBS), styrene-isoprene-styrene (SIS), styrene-isobutylene-styrene (SIBS), or a combination thereof.

For example, one of the non-stretchable thin film transistor or the stretchable thin film transistor may be a switching thin film transistor and the other may be a driving thin film transistor. The switching thin film transistor is electrically connected to the gate line and the data line and may control on/off of the pixel (or subpixel) PX, and the driving thin film transistor is electrically connected to the switching thin film transistor and the driving voltage line to drive the pixel (or subpixel) PX. For example, the switching thin film transistor may include a first gate electrode electrically connected to a gate line; a first source electrode electrically connected to the data line; a first drain electrode facing the first source electrode; and a first semiconductor layer electrically connected to the first source electrode and the first drain electrode, respectively. For example, the driving thin film transistor may include a second gate electrode electrically connected to the first drain electrode; a second source electrode connected to the driving voltage line; a second drain electrode facing the second source electrode; a second semiconductor layer electrically connected to the second source electrode and the second drain electrode, respectively. The switching thin film transistor and the driving thin film transistor may include the same or different semiconductor layers.

For example, the driving thin film transistor may have high charge transfer characteristics, and thus may include silicon, an oxide semiconductor, or a combination thereof as an active layer having such high charge transfer characteristics. Since the silicon and/or oxide semiconductor may be a non-stretchable semiconductor layer as described above, the driving thin film transistor may be a non-stretchable thin film transistor.

For example, the switching thin film transistor may have a low leakage current characteristic for high on/off characteristics, and may include an organic semiconductor, an oxide semiconductor, or a combination thereof having such a low leakage current characteristic as an active layer. Since the organic semiconductor and the oxide semiconductor may be stretchable semiconductor as described above, the switching thin film transistor may be a stretchable thin film transistor.

As described above, a portion of the plurality of thin film transistors included in each pixel circuit 120 is disposed (e.g., located) in a region (stretchable region) other than the pixel PX, so that an area occupied by the thin film transistors in the pixel PX may be reduced compared with a structure in which all the thin film transistors are disposed in each pixel PX, thereby overcoming a limitation of the reduction in a size of the pixel PX to effectively decrease the pixel size, thereby enabling an increased number of pixels in a given stretchable panel area, thereby enabling increased pixel resolution in the stretchable panel and thus improving the image display performance of the stretchable panel.

Specifically, the stretchable panel 1000 according to some example embodiments has a separate region (e.g., stretchable region 1000-2) for providing stretchability, and accordingly, an area occupied by the pixel PX relative to the total area of the stretchable substrate 110*a* may be inevitably reduced compared to a general non-stretchable panel using a glass substrate.

Meanwhile, in general, the size of the pixel PX cannot be smaller than the area occupied by the pixel circuits 120. In some example embodiments, a portion of the pixel circuits 120, i.e., a portion of the thin film transistors are arranged in an area (stretchable area) other than the pixel PX so that the area of the pixel circuits 120 in the pixel PX may be effectively reduced, and accordingly, the size of the pixel PX may also be effectively reduced. Accordingly, the stretchable panel 1000 having a high resolution (e.g., high pixel resolution) may be realized by overcoming the limitation of spatial arrangement of the stretchable panel 1000 and increasing the number of pixels PX per unit area on the stretchable substrate 110a.

In FIGS. 2 and 3, the first pixel circuit 120a and the second pixel circuit 120b are illustrated in arbitrary shapes and sizes for explanation, but the first pixel circuit 120a and the second pixel circuit 120b are illustrated may vary in shape and size. Also, although the first pixel circuit 120a and the second pixel circuit 120b are shown at arbitrary positions in FIGS. 2 and 3 for explanation, the first pixel circuit 120a may be disposed anywhere in the non-stretchable region 1000-1 of the stretchable substrate 110a, and the second pixel circuit 120b may be disposed anywhere in the stretchable region 1000-2 of the stretchable substrate 110a.

For example, the number (e.g., quantity) of the second pixel circuits 120b (e.g., switching thin film transistors) included in each pixel circuit 120 may be equal to or less than the number (e.g., quantity) of the first pixel circuits 120a (e.g., driving thin film transistors and capacitors) included in each pixel circuit 120. For example, the number of the second pixel circuits 120b (e.g., switching thin film transistors) included in each pixel circuit 120 may be greater than the number of the first pixel circuits 120a (e.g., driving thin film transistors and capacitors) included in each pixel circuit 120. For example, the number of first pixel circuits 120a (e.g., driving thin film transistors and capacitors) included in each pixel circuit 120 may be 1 to 10. For example, the number of second pixel circuits 120b (e.g., switching thin film transistors) included in each pixel circuit 120 may be 1 to 10.

The plurality of unit elements 130 are repeatedly arranged on the stretchable substrate 110a, and each separate unit element 130 may define a separate pixel (or subpixel) PX of the stretchable panel 1000. The plurality of unit elements 130 may be arranged along rows and/or columns to form a unit element array. The unit element array may be arranged, for example, in a Bayer matrix, a Pentile matrix, and/or a diamond matrix, similarly to the arrangement of the pixels PX, but is not limited thereto.

For example, each unit element 130 may be a light emitting diode configured to independently display red (e.g., light in a red wavelength spectrum), green (e.g., light in a green wavelength spectrum), blue (e.g., light in a blue wavelength spectrum), or any combination thereof. For example, each unit element 130 may be an organic light emitting diode, an inorganic light emitting diode, a quantum dot light emitting diode, a micro light emitting diode or a perovskite light emitting diode, but is not limited thereto.

For example, each unit element 130 may be a photoelectric diode configured to absorb light of a particular (or, alternatively, predetermined) wavelength spectrum and convert the absorbed light into an electrical signal, and may be, for example, an inorganic photoelectric conversion diode, an organic photoelectric conversion diode, or an organic/inorganic photoelectric conversion diode, but is not limited thereto.

For example, referring to FIG. 4, each separate unit element 130 may include an anode 131; cathode 132; a light emitting layer or photoelectric conversion layer 133 between the anode 131 and the cathode 132, and optionally auxiliary layers 134a and/or 134b between the anode 131 and the light emitting layer or photoelectric conversion layer 133 and/or the cathode 132 and the light emitting layer or photoelectric conversion layer 133.

At least one of the anode 131 or the cathode 132 may be a light transmitting electrode. For example, the anode 131 may be a light transmitting electrode and the cathode 132 may be a reflective electrode. For example, the anode 131 may be a reflective electrode and the cathode 132 may be a light transmitting electrode. For example, the anode 131 and the cathode 132 may each be a light transmitting electrode. The light-transmitting electrode may be made of (e.g., may comprise), for example, a transparent conductor such as indium tin oxide (ITO) or indium zinc oxide (IZO) or a single-layer with a thin thickness or multi-layer metal thin film. When one of the anode 131 or the cathode 132 is an opaque electrode, the opaque electrode may be made of an opaque conductor such as aluminum (Al).

The light emitting layer or photoelectric conversion layer 133 may be configured to emit light in a red wavelength spectrum, a green wavelength spectrum, a blue wavelength spectrum, an infrared wavelength spectrum, or a combination thereof, and may include, for example, an organic light emitting layer, an inorganic light emitting layer, an organic/inorganic light emitting layer, or a combination thereof. The light emitting layer or photoelectric conversion layer 133 may include at least one host material and at least one dopant.

The light emitting layer or photoelectric conversion layer 133 may be configured to absorb light of a red wavelength spectrum, a green wavelength spectrum, a blue wavelength spectrum, an infrared wavelength spectrum, or a combination thereof and convert the absorbed light into an electrical signal, and may include, for example, an organic photoelectric conversion layer, an inorganic photoelectric conversion layer, an organic-inorganic photoelectric conversion layer, or a combination thereof. The light emitting layer or photoelectric conversion layer 133 may include at least one p-type semiconductor and at least one n-type semiconductor.

The light emitting layer or photoelectric conversion layer 133 may include a first compound as the p-type semiconductor or the n-type semiconductor.

The first compound may be a light absorber capable of selectively absorbing light of a particular (or, alternatively, predetermined) wavelength band among visible ray regions. For example, the first compound may selectively absorb light in a green wavelength band. For example, the maximum absorption wavelength ($\lambda_{max}$) of the first compound may be between about 500 nm to 600 nm and may have an energy bandgap of about 2.0 to 2.5 eV.

For example, the first compound may be a p-type semiconductor that may be an organic material having a core structure including an electron donating moiety EDM, a π-conjugated linking moiety LM, and an electron accepting moiety EAM according to Chemical Formula 1.

$$\text{EDM-LM-EAM} \qquad \text{[Chemical Formula 1]}$$

In Chemical Formula 1,
EDM may be an electron donating moiety,
EAM may be an electron accepting moiety, and
LM may be a pi conjugated linking moiety to link the electron donating moiety and the electron accepting moiety.

For example, the light emitting layer or photoelectric conversion layer 133 may include a first compound as the p-type semiconductor that may be represented by Chemical Formula 2.

[Chemical Formula 2]

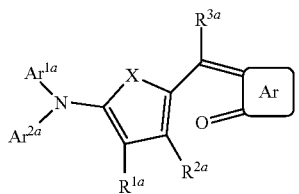

In Chemical Formula 2,

X may be O, S, Se, Te, SO, SO$_2$, CR$^b$R$^c$, or SiR$^d$R$^e$,

Ar may be a substituted or unsubstituted C6 to C30 arylene group, a substituted or unsubstituted C3 to C30 heterocyclic group, or a fused ring of two or more selected therefrom, Ar$^{1a}$ and Ar$^{2a}$ may each independently be a substituted or unsubstituted C6 to C30 aryl(ene) group or a substituted or unsubstituted C3 to C30 heteroaryl(ene) group, R$^{1a}$ to R$^{3a}$ and R$^b$ to R$^e$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof, and Ar$^{1a}$, Ar$^{2a}$, R$^{1a}$, and R$^{2a}$ may each independently be present, or two adjacent ones may be linked to each other to form a ring.

For example, Ar$^{1a}$ and Ar$^{2a}$ may each independently be a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

For example, Ar$^{1a}$ and Ar$^{2a}$ may be linked to each other to form a ring.

For example, Ar$^{2a}$ and R$^{1a}$ may be linked to each other to form a ring.

For example, the light emitting layer or photoelectric conversion layer 133 may include an n-type semiconductor, in addition to a first compound that is the p-type semiconductor, that may be fullerene or a fullerene derivative, thiophene or a thiophene derivative, or any combination thereof, but is not limited thereto.

The auxiliary layers 134a and 134b may be, for example, charge auxiliary layers, for example, a hole transport layer, a hole injection layer, a hole extraction layer, an electron blocking layer, an electron transport layer, an electron injection layer, an electron extraction layer, a hole blocking layer, or a combination thereof, but the present inventive concepts are not limited thereto.

The auxiliary layers 134a and 134b may include, for example, an organic material, an inorganic material, or an organic/inorganic material. The organic material may be an organic compound having hole or electron characteristics, and the inorganic material may be, for example, a metal oxide such as molybdenum oxide, tungsten oxide, or nickel oxide.

The hole transport layer (HTL) may include one selected from, for example, a poly(3,4-ethylenedioxythiophene):poly(styrenesulfonate) (PEDOT:PSS), a polyaryl amine, a poly(N-vinylcarbazole), a polyaniline, a polypyrrole, an N,N,N',N'-tetrakis(4-methoxyphenyl)-benzidine (TPD), a 4-bis[N-(1-naphthyl)-N-phenyl-amino]biphenyl (α-NPD), an m-MTDATA, a 4,4',4"-tris(N-carbazolyl)-triphenylamine (TCTA), and any combination thereof, but is not limited thereto.

The electron blocking layer (EBL) may include one selected from, for example, a poly(3,4-ethylenedioxythiophene):poly(styrenesulfonate), (PEDOT: PSS), a poly Arylamine, a poly(N-vinylcarbazole), a polyaniline, a polypyrrole, an N,N,N',N'-tetrakis (4-methoxyphenyl)-benzidine (TPD), a 4-bis[N-(1-naphthyl)-N-phenyl-amino]biphenyl (α-NPD), an m-MTDATA, a 4,4',4"-tris(N-carbazolyl)-triphenylamine (TCTA), and any combination thereof, but is not limited thereto.

The electron transport layer (ETL) may include one selected from, for example, a 1,4,5,8-naphthalene-tetracarboxylic dianhydride (NTCDA), a bathocuproine (BCP), an LiF, an Alq3, a Gaq3, an Inq3, a Znq2, a Zn(BTZ)2, a BeBq2 and any combination thereof, but is not limited thereto.

The hole blocking layer (HBL) may include one selected from, for example, a 1,4,5,8-naphthalene-tetracarboxylic dianhydride (NTCDA), bathocuproine (BCP), an LiF, an Alq3, a Gaq3, an Inq3, a Znq2, a Zn(BTZ)2, a BeBq2 and any combination thereof, but is not limited thereto.

Any one of the auxiliary layers 134a and 134b may be omitted.

Referring back to FIGS. 2 and 3, the connection electrode 140 may connect to the first pixel circuit 120a of a pixel circuit 120 and/or a unit element 130 that the pixel circuit 120 is configured to operate in the non-stretchable region 1000-1 and the second pixel circuit 120b of the pixel circuit 120 in the stretchable region 1000-2. That is, the connection electrode 140 may electrically connect the first pixel circuit 120a and the second pixel circuit 120b of a separate pixel circuit 120 or may electrically connect the unit element 130 that a separate pixel circuit 120 is configured to operate and the second pixel circuit 120b of the separate pixel circuit 120. As noted, the connection electrode 140 may include a plurality of separate connection electrodes 140 that are configured to electrically connect separate, respective unit element 130 and separate, respective pixel circuits 120. The connection electrode 140 may be disposed over both the stretchable region 1000-2 and the non-stretchable region 1000-1. For example, one end of the connection electrode 140 may be disposed in the stretchable region 1000-2 and the other end of the connection electrode 140 may be disposed in the non-stretchable region 1000-1. The connection electrode 140 may be overlapped with the edge portion 110b-E (e.g., the sidewall surface) of the non-stretchable pattern 110b and the elastic structure 125 to be described later along the thickness direction (e.g., the Z direction) of the stretchable substrate 110a, respectively. The connection electrode 140 may be, for example, a stretchable electrode, and the stretchable electrode may include, for example, a conductive polymer, conductive metal particles, liquid metal, cracked metal such as cracked Au, or a combination thereof, but is not limited thereto.

The elastic structure 125 may be a stress controlling structure capable of effectively lowering stress due to an abrupt change in elastic modulus between the non-stretchable region 1000-1 and the stretchable region 1000-2 of the stretchable panel 1000. The elastic structure 125 may be disposed to be overlapped (e.g., overlapped along the thickness direction (e.g., the Z direction) of the stretchable substrate 110*a*) with the boundary 1000B between the non-stretchable region 1000-1 and the stretchable region 1000-2 of the stretchable panel 1000, and may be for example, disposed in the thickness direction of the stretchable substrate 110*a* (e.g., Z direction) to overlap with the edge portion 110*b*-E of the non-stretchable pattern 110*b*. The edge portion 110*b*-E of the non-stretchable pattern 110*b* may, in some example embodiments, define the boundary 1000B between the non-stretchable region 1000-1 and the stretchable region 1000-2 of the stretchable panel 1000. An elastic modulus of the elastic structure 125 may be between an elastic modulus of the non-stretchable region 1000-1 and an elastic modulus of the stretchable region 1000-2. The elastic structure 125 may include, for example, an elastomer (hereinafter referred to as a "second elastomer") having an elastic modulus (hereinafter referred to as a "third elastic modulus") than that is higher than that of the first elastic material having a first elastic modulus of the aforementioned stretchable substrate 110*a* and lower than that of an organic, inorganic or organic material (e.g., particular material) having a second elastic modulus of the non-stretchable pattern 110*b*. The third elastic modulus is not particularly limited as long as the third elastic modulus is between the first elastic modulus and the second elastic modulus. For example, the difference between the first elastic modulus and the second elastic modulus may be at least about 100 times, and for example, the difference between the first elastic modulus and the third elastic modulus may be at least about two times. For example, the first elastic modulus may be about $10^2$ Pa to about $10^6$ Pa, the second elastic modulus may be about $10^5$ Pa to about $10^{12}$ Pa, and the third elastic modulus may be about $10^3$ Pa to about $10^8$ Pa, but example embodiments are not limited thereto.

As such, by disposing the elastic structure 125 having an elastic modulus between the stretchable substrate 110*a* and the non-stretchable pattern 110*b* at the boundary 1000B of the non-stretchable region 1000-1 and the stretchable region 1000-2 (e.g., such that the elastic structure 125 isolates the stretchable substrate 110*a* and the non-stretchable pattern 110*b* from direct contact with each other, at least at the boundary 1000B of the non-stretchable region 1000-1 and the stretchable region 1000-2), an abrupt change in the elastic modulus at an interface between the non-stretchable region 1000-1 and the stretchable region 1000-2 may be alleviated, reduced, minimized, or prevented. By gradually changing the elastic modulus along a path extending from the stretchable substrate 110*a* to the non-stretchable pattern 110*b* through the elastic structure 125 that isolates the stretchable substrate 110*a* and the non-stretchable pattern 110*b* from direct contact with each other, at least at the boundary 1000B of the non-stretchable region 1000-1 and the stretchable region 1000-2, such as a low elastic modulus (first elastic modulus), a medium elastic modulus (third elastic modulus), and a high elastic modulus (second elastic modulus) along the thickness direction (e.g., Z direction) of the stretchable substrate 110*a*, a concentration of stress caused by stretching at the boundary 10001B between the non-stretchable region 1000-1 and the stretchable region 1000-2 may be alleviated, reduced, minimized, or prevented. In addition, the connection electrode 140 disposed over (e.g., overlapping along the thickness direction (e.g., Z direction) of the stretchable substrate 110*a*) both the non-stretchable region 1000-1 and the stretchable region 1000-2 may effectively reduce, minimize, or prevent breakage and/or damage by an abrupt change in elastic modulus at the boundary of the non-stretchable region 1000-1 and the stretchable region 1000-2, to improve stretch stability and thus stretching (e.g., deformability) performance of the stretchable panel 1000 with reduced, minimized, or prevented display and/or sensing performance of the stretchable panel 1000.

The elastic structure 125 may be disposed without particular limitation, as far as the elastic structure 125 is overlapped with a boundary 1000B of the non-stretchable region 1000-1 and the stretchable region 1000-2, that is the edge portion 110*b*-E of the non-stretchable pattern 110*b*, along the thickness direction (e.g., Z direction) of the stretchable substrate 110*a*. For example, the elastic structure 125 may be disposed under the stretchable substrate 110*a* along the thickness direction (e.g., Z direction) of the stretchable substrate 110*a*, inside the stretchable substrate 110*a*, on (e.g., above or beneath, directly or indirectly) the non-stretchable pattern 110*b*, or between the stretchable substrate 110*a* and the non-stretchable pattern 110*b* (e.g., therebetween along the thickness direction (e.g., Z direction) of the stretchable substrate 110*a* and/or in the in-plane direction (e.g., the XY direction)). In some example embodiments, the elastic structure 125 may include a plurality of separate elastic structures 125 that may be isolated from direct contact with each other and which may be overlapped with separate, respective portions of the boundary 1000B of the non-stretchable region 1000-1 and the stretchable region 1000-2, that is the edge portion 110*b*-E of the non-stretchable pattern 110*b*, along the thickness direction (e.g., Z direction) of the stretchable substrate 110*a*. In FIG. 3, an example where the elastic structure 125 is disposed inside the stretchable substrate 110*a* is illustrated as an example. Also, as described above, since the elastic structure 125 is disposed to be overlapped with the edge portion 110*b*-E of the non-stretchable pattern 110*b* along the thickness direction (e.g., Z direction) of the stretchable substrate 110*a*, a dimension (size, length, width, area in the XY plane parallel to the stretchable substrate 110*a*, etc.) of the elastic structure 125 may be larger than a corresponding dimension (size, length, width, area in the XY plane parallel to the stretchable substrate 110*a*, etc.) of at least one (e.g., a separate) unit element 130 formed on the non-stretchable pattern 110*b* (island-shaped non-stretchable pattern 110*b*-1) and overlapping the elastic structure 125 along the thickness direction (e.g., Z direction) of the stretchable substrate 110*a*. It will be understood that the elastic structure 125 may include a plurality of elastic structures 125 overlapping separate, respective unit elements 130, where a dimension of each elastic structure 125 is larger than a corresponding dimension of the separate unit element overlapping the separate elastic structure 125.

For example, the first elastomer having a first elastic modulus and the second elastomer having a third elastic modulus may each be a thermoplastic elastomer, and each independently polyorganosiloxane, a polymer including a butadiene moiety, a polymer including a urethane moiety, a polymer including an acrylic moiety, a polymer including an olefin moiety, or a combination thereof.

For example, the first elastomer and the second elastomer may each be a (co)polymer including a plurality of structural units same as or different from each other, respectively, and may each be a (co)polymer including at least one structural unit in common. For example, the first elastomer and the second elastomer may include two types of structural units, and may include one or two types of structural units in common. For example, the first elastomer and the second elastomer may include three types of structural units, and may include one, two, or three types of structural units in common.

As such, the first elastomer and the second elastomer include at least one structural unit in common, thereby reducing heterogeneity at the interface of the stretchable substrate 110a including the first elastomer and the elastic structure 125 including the second elastomer. Due to the thermoplastic properties of the first elastomer and the second elastomer, by a chemical bond such as a cross-linking between the first elastomer and the second elastomer at a temperature above the glass transition temperature (Tg) or melting temperature (Tm), adherence at the interface of the stretchable substrate 110a and the elastic structure 125 may be improved. Accordingly, it is possible to effectively reduce, minimize, or prevent the elastic structure 125 from being separated from or detached from the stretchable substrate 110a when the stretchable panel 1000 is stretched.

For example, the stretchable substrate 110a and the elastic structure 125 may be formed by coating a solution (or dispersion) including a first elastomer and a solution (or dispersion) including a second elastomer, respectively and then drying them. At this time, the solution (or dispersion) including the first elastomer and the solution (or dispersion) including the second elastomer may further include a curing agent such as a light curing agent and/or a thermal curing agent, respectively, to improve chemical resistance, and at the same time, by further promoting chemical bonding such as crosslinking of the aforementioned first elastomer and the second elastomer, adherence at the interface of the stretchable substrate 110a and the elastic structure 125 may be further improved.

For example, the first elastomer and the second elastomer may each independently include a copolymer including at least one hard structural unit providing relatively hard physical properties and at least one soft structural unit providing relatively soft physical properties.

The hard structural unit may provide plastic properties such as, for example, high-temperature performance, thermoplastic processability, tensile strength and tear strength, and the soft structural unit may provide low-temperature performance, hardness, flexibility, and elastomeric properties such as tension/compression. The first elastomer and the second elastomer may exhibit thermoplastic elastic properties by properly disposing the hard structural unit and the soft structural unit.

The hard structural units and the soft structural units may be respectively alternately arranged or arranged in clusters or blocks in the first elastomer and the second elastomer.

For example, the hard structural unit may include, for example, a styrene-containing structural unit, a urethane-containing structural unit, an ether-containing structural unit, or a combination thereof, but is not limited thereto. For example, the soft structural unit may include, for example, an ethylene structural unit, a propylene structural unit, a butylene structural unit, an isobutylene structural unit, a butadiene structural unit, an isoprene structural unit, a neoprene structural unit, a combination thereof, but is not limited thereto.

For example, the first elastomer and the second elastomer may include at least one hard structural unit in common, for example, a styrene-containing structural unit, a urethane-containing structural unit, an ether-containing structural unit, or a combination thereof. Accordingly, the first elastomer and the second elastomer may belong to any one of a styrene-containing polymer, a urethane-containing polymer, and an ether-containing polymer in common.

For example, the first elastomer and the second elastomer may include a styrene-containing structural unit as a hard structural unit in common, and may include the same or different soft structural units. For example, the first elastomer and the second elastomer may commonly include a styrene-containing structural unit as a hard structural unit, and an ethylene structural unit, a propylene structural unit, a butylene structural unit, an isobutylene structural unit, a butadiene structural unit, an isoprene structural unit, a neoprene structural unit, or a combination thereof.

For example, the first elastomer and the second elastomer may each be a styrene-containing polymer, and may include, for example, each independently one selected from styrene-ethylene-butylene-styrene (SEBS), styrene-ethylene-propylene-styrene (SEPS), styrene-butadiene-styrene (SBS), styrene-isoprene-styrene (SIS), styrene-isobutylene-styrene (SIBS), and a combination thereof.

For example, any one of the first elastomer and the second elastomer may include styrene-ethylene-butylene-styrene (SEBS), and the other one of the first elastomer and the second elastomer may include styrene-ethylene-butylene-styrene (SEBS), styrene-ethylene-propylene-styrene (SEPS), styrene-butadiene-styrene (SBS), styrene-isoprene-styrene (SIS), styrene-isobutylene-styrene (SIBS), or a combination thereof.

For example, the first elastomer may include styrene-ethylene-butylene-styrene (SEBS), and the second elastomer may include one selected from styrene-ethylene-butylene-styrene (SEBS), styrene-ethylene-propylene-styrene (SEPS), styrene-butadiene-styrene (SBS), styrene-isoprene-styrene (SIS), styrene-isobutylene-styrene (SIBS), and a combination thereof.

For example, the first elastomer and the second elastomer may each include styrene-ethylene-butylene-styrene (SEBS).

For example, the elastic modulus of the first elastomer and the second elastomer may be differently adjusted as described above by adjusting the ratio of the aforementioned hard structural unit and soft structural unit.

For example, a weight ratio of the hard structural unit to the soft structural unit of the second elastomer may be greater than the weight ratio of the hard structural unit to the soft structural unit of the first elastomer, so that an elastic modulus of the second elastomer is higher than an elastic modulus of the first elastomer. For example, the weight ratio of the hard structural unit to the soft structural unit of the second elastomer is about 2 times, about 3 times, about 4 times, about 5 times, about 7 times, or about 10 times or greater than the weight ratio of the hard structural unit to the soft structural unit of the first elastomer.

For example, the weight ratio of the hard structural unit to the soft structural unit of the second elastomer may be greater than about 1, and within the above range, greater than or equal to about 1.1, greater than or equal to about 1.2, greater than or equal to about 1.3, greater than or equal to about 1.4, greater than or equal to about 1.5, greater than or equal to about 1.7, greater than or equal to about 1.9, or greater than or equal to about 2.0, greater than about 1.0 and less than or equal to about 9.9, about 1.1 to 9.9, about 1.2 to 9.9, about 1.3 to about 9.9, about 1.4 to about 9.9, about 1.5 to about 9.9, about 1.7 to about 9.9, about 1.9 to about 9.9, or about 2.0 to about 9.9.

For example, the weight ratio of the hard structural unit to the soft structural unit of the first elastomer may be less than or equal to about 1, and within the above range, less than or equal to about 0.9, less than or equal to about 0.8, less than or equal to about 0.7, less than or equal to about 0.6, less than or equal to about 0.5, less than or equal to about 0.4, or less than or equal to about 0.3, or may be about 0.01 to about 0.9, about 0.01 to about 0.8, about 0.01 to about 0.7, about 0.01 to about 0.6, about 0.01 to about 0.5, about 0.01 to about 0.4, or about 0.01 to about 0.3.

For example, the weight ratio of the hard structural unit to the soft structural unit of the second elastomer may be greater than or equal to about 1.2, and the weight ratio of the hard structural unit to the soft structural unit of the first elastomer may be less than or equal to about 0.7.

For example, the weight ratio of the hard structural unit to the soft structural unit of the second elastomer may be greater than or equal to about 1.5 and the weight ratio of the hard structural unit to the soft structural unit of the first elastomer may be less than or equal to about 0.5.

As described above, by adjusting the ratio of the hard structural unit and the soft structural unit of the first elastomer and the second elastomer differently, the stretchable substrate 110a and the elastic structure 125 may be adjusted to have a desired elastic modulus.

As another example, the first elastomer and the second elastomer may be a copolymer having the same structural unit, and the stretchable substrate 110a and the elastic structure 125 may be formed to have different elastic modulus by different curing conditions during curing process. For example, the elastic structure 125 may be formed to have a higher elastic modulus than the stretchable substrate 110a by a stronger light intensity, a longer curing time, or a combination thereof than the stretchable substrate 110a during curing process.

As described above, in the stretchable panel 1000, at least a portion of the pixel circuit 120 (e.g., at least a portion of a thin film transistor) may be disposed in the stretchable region 1000-2, so that a limitation of the pixel arrangement space due to the stretchable region 1000-2 may be overcome and the number of pixels per unit area may be increased. For example, the number of pixels per unit area in the stretchable panel 1000 may be greater than or equal to about 150 ppi (pixel per inch), greater than or equal to about 200 ppi, greater than or equal to about 250 ppi, greater than or equal to about 300 ppi, greater than or equal to about 350 ppi, greater than or equal to about 400 ppi, greater than or equal to about 450 ppi, or greater than or equal to about 500 ppi and may be, for example, about 150 ppi to about 1000 ppi, about 200 ppi to about 1000 ppi, about 250 ppi to about 1000 ppi, about 300 ppi to about 1000 ppi, about 350 ppi to about 1000 ppi, about 400 ppi to about 1000 ppi, about 450 ppi to about 1000 ppi, or about 500 ppi to about 1000 ppi.

In addition, by disposing the elastic structure 125 having an elastic modulus between the elastic modulus of the stretchable region 1000-2 and the elastic modulus of the non-stretchable region 1000-1 at the boundary 1000B of the non-stretchable region 1000-1 and the stretchable region 1000-2 of the stretchable panel 1000, an abrupt change in the elastic modulus between the non-stretchable region 1000-1 and the stretchable region 1000-2 (e.g., at the boundary 1000B) may be alleviated, reduced, minimized, or prevented and by gradually changing the elastic modulus such as a low elastic modulus (first elastic modulus), a medium elastic modulus (third elastic modulus), and a high elastic modulus (second elastic modulus) along the thickness direction (e.g., Z direction) of the stretchable substrate 110a, a concentration of stress caused by stretching of the stretchable panel 1000 at the boundary 1000B of the non-stretchable region 1000-1 and the stretchable region 1000-2 may be alleviated, reduced, minimized, or prevented, and thus disconnection and/or damage to the connection electrode 140 at the boundary 1000B of the non-stretchable region 1000-1 and the stretchable region 1000-2 may be effectively reduced, minimized, or prevented, thereby improving stretching stability of the stretchable panel 1000.

In addition, since the first elastomer of the stretchable substrate 110a and the second elastomer of the elastic structure 125 include the same or similar (co)polymer to each other, adherence at the interface of the stretchable substrate 110a and the elastic structure 125 may be improved and thus further improve the aforementioned stretch stability of the stretchable panel 1000 more effectively.

While the example embodiments shown in at least FIGS. 2-3 illustrate a stretchable pattern that includes a plurality of unit elements 130 on the non-stretchable pattern 110b, a plurality of pixel circuits 120 configured to independently operate separate, respective unit elements 130 of the plurality of unit elements 130, and a connection electrode 140 configured to electrically connect each unit element 130 of the plurality of unit elements 130 and each pixel circuit 120 of the plurality of pixel circuits 120, it will be understood that some example embodiments are not limited thereto, and in some example embodiments a stretchable panel 1000 according to any of the example embodiments may include a stretchable substrate 110a, the stretchable substrate 110a including a first elastomer having a first elastic modulus, a non-stretchable pattern 110b covering a portion of the stretchable substrate 110a, the non-stretchable pattern 110b including a particular material that includes an organic, inorganic, or organic-inorganic material, the particular material having a second elastic modulus higher than the first elastic modulus, at least one unit element 130 on the non-stretchable pattern 110b, at least one pixel circuit 120 configured to operate the at least one unit element 130, and a connection electrode 140 configured to electrically connect the at least one unit element 130 and the at least one pixel circuit 120, and an elastic structure 125 overlapped with an edge portion 110b-E of the non-stretchable pattern 110b along a thickness direction (e.g., Z direction) of the stretchable substrate 110a, the elastic structure 125 including a second elastomer having a third elastic modulus higher than the first elastic modulus and lower than the second elastic modulus.

Hereinafter, a stretchable panel according to another example will be described.

Figure 5:
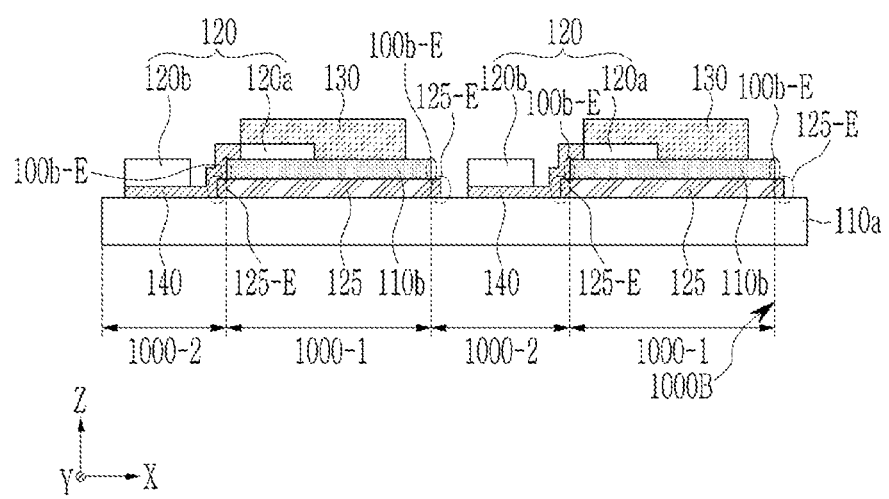
FIG. 5 is a cross-sectional view according to another example of the stretchable panel along cross-sectional view line III-III' of FIG. 2 according to some example embodiments.

FIG. 5 is a cross-sectional view according to another example of the stretchable panel along cross-sectional view line III-III' of FIG. 2 according to some example embodiments.

Referring to FIG. 5, the stretchable panel 1000 according to some example embodiments includes a stretchable substrate 110a; a non-stretchable pattern 110b having an edge portion 110b-E; a pixel circuit 120 including a first pixel circuit 120a and a second pixel circuit 120b; a unit element 130; a connection electrode 140; and an elastic structure 125, as in some example embodiments, including example embodiments shown in at least FIG. 3. Descriptions of the stretchable substrate 110a, the non-stretchable pattern 110b, the pixel circuit 120, the unit element 130, and the connection electrode 140 are the same as described above.

However, unlike some example embodiments, including example embodiments shown in at least FIG. 3, the elastic structure 125 in the example embodiments shown in FIG. 5 is disposed on the stretchable substrate 110a, specifically, between the stretchable substrate 110a and the non-stretchable pattern 110*b* along the thickness direction (e.g., Z direction) of the stretchable substrate 110*a*.

The stretchable panel 1000 according to some example embodiments, including example embodiments shown in at least FIG. 5, has a structure in which a stretchable substrate 110*a* having a low elastic modulus (first elastic modulus), an elastic structure 125 having a medium elastic modulus (third elastic modulus), and a non-stretchable pattern 110*b* having a high elastic modulus (second elastic modulus) are sequentially stacked, and thereby the elastic modulus may be gradually changed along the thickness direction (e.g., Z direction) of the stretchable substrate 110*a*, to effectively disperse concentration of stress during stretching of the stretchable panel 1000 as described above.

In the stretchable panel 1000 according to some example embodiments, the connection electrode 140 may be disposed over (e.g., may overlap along the thickness direction of the stretchable substrate 110*a*) both the stretchable region 1000-2 and the non-stretchable region 1000-1, and for example, may cover (e.g., may overlap along the thickness direction of the stretchable substrate 110*a*) the edge portion 125-E of the elastic structure 125 and the edge portion 110*b*-E of the non-stretchable pattern 110*b*, respectively.

Hereinafter, a stretchable panel according to some example embodiments will be described.

Figure 6:
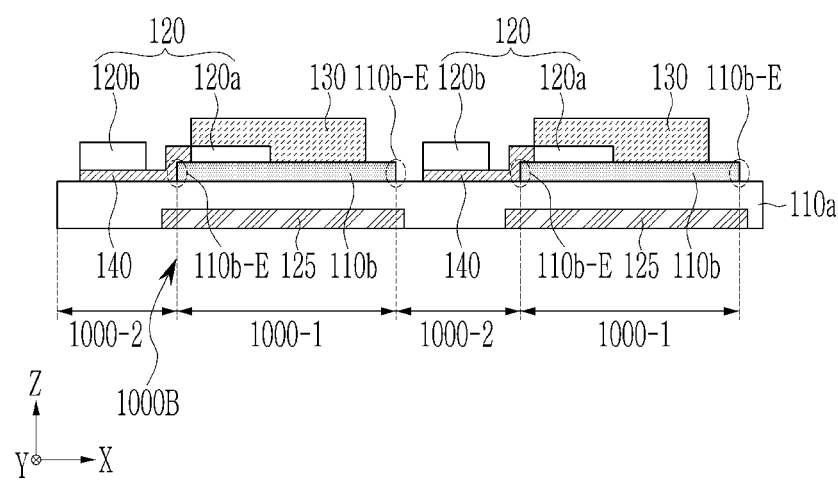
FIG. 6 is a cross-sectional view according to another example of the stretchable panel along cross-sectional view line III-III' of FIG. 2 according to some example embodiments.

FIG. 6 is a cross-sectional view according to another example of the stretchable panel along cross-sectional view line III-III' of FIG. 2 according to some example embodiments.

Referring to FIG. 6, the stretchable panel 1000 according to some example embodiments includes a stretchable substrate 110*a*; a non-stretchable pattern 110*b* having an edge portion 110*b*-E; a pixel circuit 120 including a first pixel circuit 120*a* and a second pixel circuit 120*b*; a unit element 130; a connection electrode 140; and an elastic structure 125, as in some example embodiments, including example embodiments shown in at least FIG. 3. Descriptions of the stretchable substrate 110*a*, the non-stretchable pattern 110*b*, the pixel circuit 120, the unit element 130, and the connection electrode 140 are the same as described above.

However, unlike some example embodiments, including example embodiments shown in at least FIG. 3, the elastic structure 125 is disposed at a lower portion in (e.g., within, inside, etc.) the stretchable substrate 110*a*, and specifically, the elastic structure 125, the stretchable substrate 110*a*, and the non-stretchable pattern 110*b* may be sequentially stacked along the thickness direction (e.g., Z direction) of the stretchable substrate 110*a*.

This may be formed by, for example, coating or depositing a second elastomer having a third elastic modulus on a rigid supporting plate such as a glass substrate to form a layer, selectively patterning the layer to form the elastic structure 125, then coating or depositing a first elastomer having a first elastic modulus to form the stretchable substrate 110*a*, and removing the supporting plate.

The stretchable panel 1000 according to some example embodiments, including the example embodiments shown in FIG. 6, has a structure in which the elastic structure 125 having a medium elastic modulus (third elastic modulus), the stretchable substrate 110*a* having a low elastic modulus (first elastic modulus), and the non-stretchable pattern 110*b* having a high elastic modulus (second elastic modulus) are sequentially stacked, thereby lowering an average elastic modulus along the thickness direction (e.g., Z direction) of the stretchable substrate 110*a* to effectively disperse concentration of stress during stretching as described above.

Hereinafter, a stretchable panel according to some example embodiments will be described.

Figure 7:
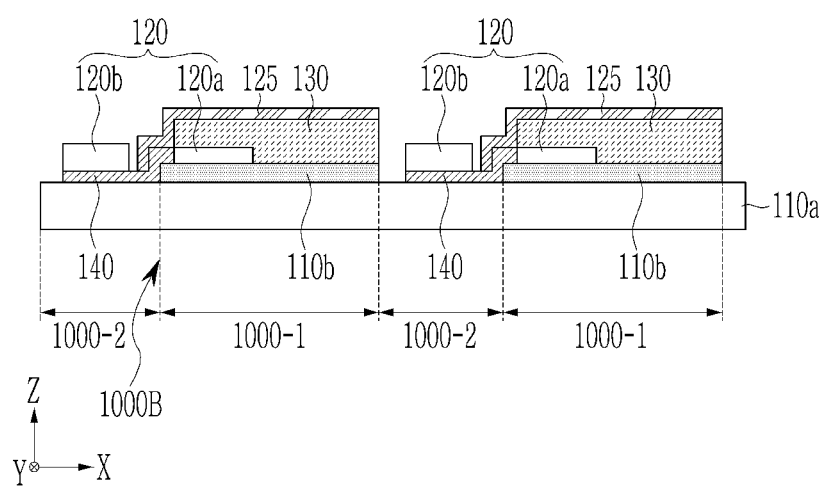
FIG. 7 is a cross-sectional view according to another example of the stretchable panel along cross-sectional view line III-III' of FIG. 2 according to some example embodiments.

FIG. 7 is a cross-sectional view according to another example of the stretchable panel along cross-sectional view line III-III' of FIG. 2 according to some example embodiments.

Referring to FIG. 7, the stretchable panel 1000 according to some example embodiments includes a stretchable substrate 110*a*; a non-stretchable pattern 110*b* having an edge portion 110*b*-E; a pixel circuit 120 including a first pixel circuit 120*a* and a second pixel circuit 120*b*; a unit element 130; a connection electrode 140; and an elastic structure 125, as in some example embodiments, including example embodiments shown in at least FIG. 3. Descriptions of the stretchable substrate 110*a*, the non-stretchable pattern 110*b*, the pixel circuit 120, the unit element 130, and the connection electrode 140 are the same as described above.

However, unlike some example embodiments, including example embodiments shown in at least FIG. 3, the elastic structure 125 is disposed on (e.g., above) the non-stretchable pattern 110*b*, and specifically, the stretchable substrate 110*a*, the non-stretchable pattern 110*b*, and the elastic structure 125 may be sequentially stacked along the thickness direction (e.g., Z direction) of the stretchable substrate 110*a*.

The stretchable panel 1000 according to some example embodiments, including the example embodiments shown in FIG. 7, has a structure in which a stretchable substrate 110*a* having a low elastic modulus (first elastic modulus), a non-stretchable pattern 110*b* having a high elastic modulus (second elastic modulus), and the elastic structure 125 having an intermediate elastic modulus (third elastic modulus) are sequentially stacked, thereby lowering an average elastic modulus along the thickness direction (e.g., Z direction) of the stretchable substrate 110*a* to effectively disperse concentration of stress during stretching as described above.

Hereinafter, a stretchable panel according to some example embodiments will be described.

Figure 8:
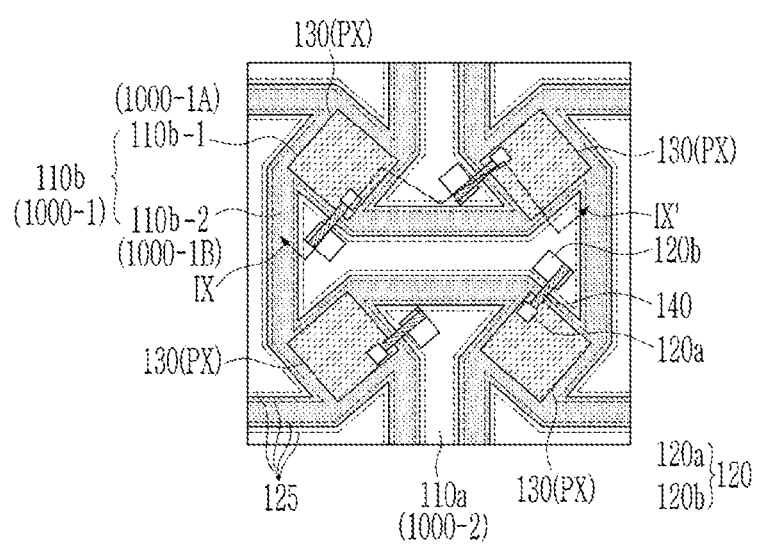
FIG. 8 is a plan view according to another example showing an enlarged portion "A" of FIG. 1 according to some example embodiments.
Figure 9:
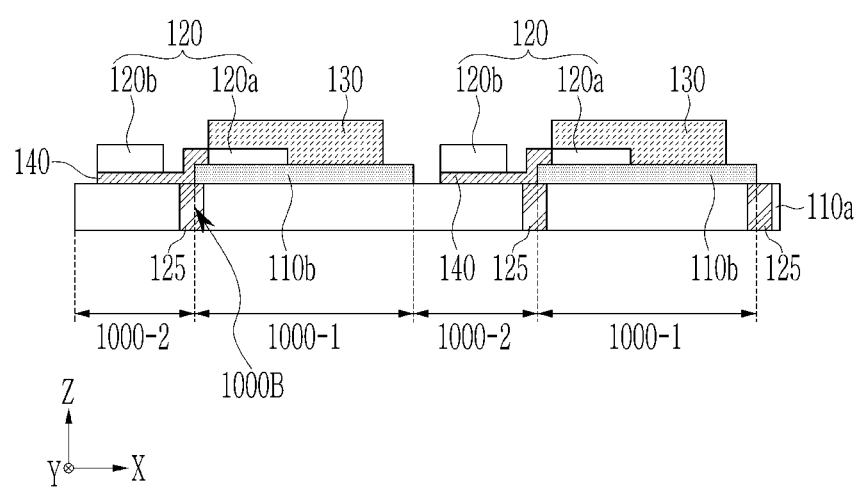
FIG. 9 is a cross-sectional view according to an example of the stretchable panel along cross-sectional view line IX-IX' of FIG. 8 according to some example embodiments.

FIG. 8 is a plan view according to another example showing an enlarged portion "A" of FIG. 1 according to some example embodiments, and FIG. 9 is a cross-sectional view according to an example of the stretchable panel along cross-sectional view line IX-IX' of FIG. 8 according to some example embodiments.

Referring to FIGS. 8 and 9, the stretchable panel 1000 according to some example embodiments includes a stretchable substrate 110*a*; a non-stretchable pattern 110*b* having an edge portion 110*b*-E; a pixel circuit 120 including a first pixel circuit 120*a* and a second pixel circuit 120*b*; a unit element 130; a connection electrode 140; and an elastic structure 125, as in some example embodiments, including example embodiments shown in at least FIG. 3. Descriptions of the stretchable substrate 110*a*, the non-stretchable pattern 110*b*, the pixel circuit 120, the unit element 130, and the connection electrode 140 are the same as described above.

However, unlike some example embodiments, including example embodiments shown in at least FIG. 3, the elastic structure 125 is may be selectively disposed at the boundary 1000B of the non-stretchable region 1000-1 and the stretchable region 1000-2 of the stretchable panel 1000 and may be, for example, selectively disposed in the thickness direction (e.g., Z direction) of the stretchable substrate 110*a* along a portion where the edge portion 110*b*-E of the non-stretchable pattern 110*b* are disposed. For example, the elastic structure 125 may be in the shape of a rod stretchable extending in one direction. At this time, since the elastic structure 125 is disposed to selectively be overlapped with the edge portion 110*b*-E of the non-stretchable pattern 110*b* along the thickness direction (e.g., Z direction) of the stretchable substrate 110a, each elastic structure 125 may not be overlapped with each unit element 130 along the thickness direction (e.g., Z direction) of the stretchable substrate 110a.

The stretchable panel 1000 according to some example embodiments, including example embodiments shown in at least FIGS. 8-9 is formed by selectively disposing the elastic structure 125 at the boundary 1000B of the non-stretchable region 1000-1 and the stretchable region 1000-2, and thereby concentration of stress during stretching may be effectively dispersed by alleviating or removing abrupt changes in elastic modulus and at the same time stretchability of the stretchable panel 1000 may be further increased by reducing an area occupied by the elastic structure 125 in the stretchable panel 1000.

Hereinafter, a stretchable panel according to some example embodiments will be described.

Figure 10:
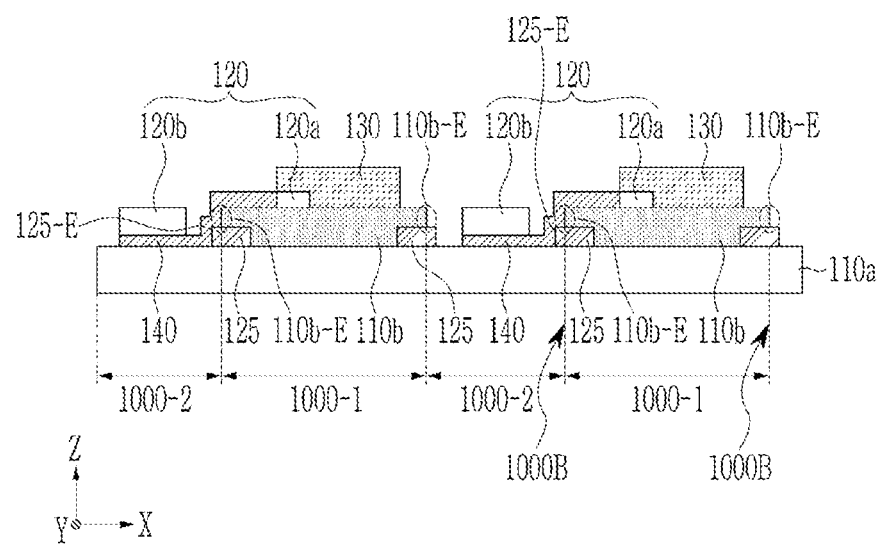
FIG. 10 is a cross-sectional view according to some example embodiments of the stretchable panel along cross-sectional view line IX-IX' of FIG. 8 according to some example embodiments.

FIG. 10 is a cross-sectional view according to another example of the stretchable panel along cross-sectional view line IX-IX' of FIG. 8 according to some example embodiments.

Referring to FIG. 10, the stretchable panel 1000 according to some example embodiments includes a stretchable substrate 110a; a non-stretchable pattern 110b having an edge portion 110b-E; a pixel circuit 120 including a first pixel circuit 120a and a second pixel circuit 120b; a unit element 130; a connection electrode 140; and an elastic structure 125, as in some example embodiments, including example embodiments shown in at least FIG. 3. Descriptions of the stretchable substrate 110a, the non-stretchable pattern 110b, the pixel circuit 120, the unit element 130, and the connection electrode 140 are the same as described above.

However, unlike some example embodiments, including example embodiments shown in at least FIG. 3, the elastic structure 125 in some example embodiments, including example embodiments shown in at least FIG. 10, is selectively disposed at the boundary 1000B between the non-stretchable region 1000-1 and the stretchable region 1000-2 on the stretchable substrate 110a, specifically, between the stretchable substrate 110a and the non-stretchable pattern 110b.

The stretchable panel 1000 according to some example embodiments, including example embodiments shown in at least FIG. 10 has a structure in which a stretchable substrate 110a having a low elastic modulus (first elastic modulus), an elastic structure 125 having a medium elastic modulus (third elastic modulus), and a non-stretchable pattern 110b having a high elastic modulus (second elastic modulus) are sequentially stacked, and thereby the elastic modulus is gradually changed along the thickness direction (e.g., Z direction) of the stretchable substrate 110a, to effectively disperse concentration of stress during stretching as described above.

In the stretchable panel 1000 according to some example embodiments, including example embodiments shown in at least FIG. 10, the connection electrode 140 may be disposed over (e.g., above, in the thickness direction of the stretchable substrate 110a) both the stretchable region 1000-2 and the non-stretchable region 1000-1, and for example, may cover the edge portion 125-E of the elastic structure 125 and the edge portion 110b-E of the non-stretchable pattern 110b, respectively.

Hereinafter, a stretchable panel according to some example embodiments will be described.

Figure 11:
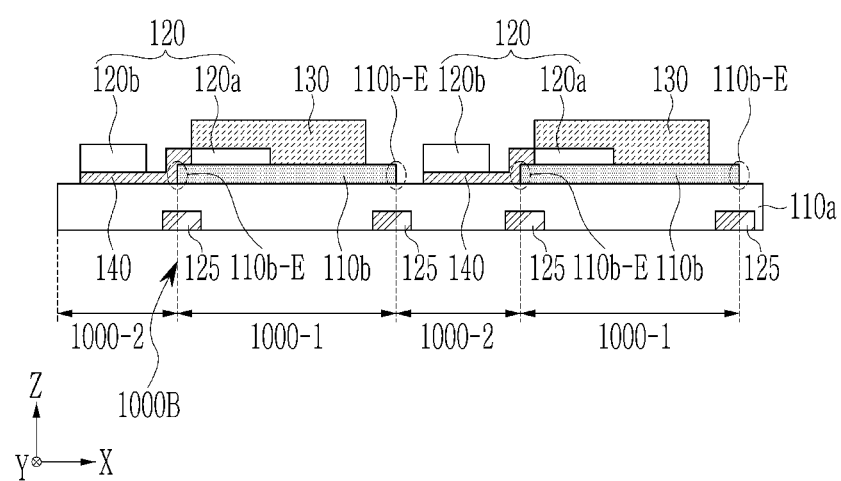
FIG. 11 is a cross-sectional view according to some example embodiments of the stretchable panel along cross-sectional view line IX-IX' of FIG. 8 according to some example embodiments.

FIG. 11 is a cross-sectional view according to another example of the stretchable panel along cross-sectional view line IX-IX' of FIG. 8 according to some example embodiments.

Referring to FIG. 11, the stretchable panel 1000 according to some example embodiments includes a stretchable substrate 110a; a non-stretchable pattern 110b having an edge portion 110b-E; a pixel circuit 120 including a first pixel circuit 120a and a second pixel circuit 120b; a unit element 130; a connection electrode 140; and an elastic structure 125, as in some example embodiments, including example embodiments shown in at least FIG. 3. Descriptions of the stretchable substrate 110a, the non-stretchable pattern 110b, the pixel circuit 120, the unit element 130, and the connection electrode 140 are the same as described above.

However, unlike some example embodiments, including example embodiments shown in at least FIG. 3, the elastic structure 125 in some example embodiments, including example embodiments shown in at least FIG. 11, is selectively disposed at (e.g., overlapping along the thickness direction of the stretchable substrate 110a) the boundary 1000B of the non-stretchable region 1000-1 and the stretchable region 1000-2 under the stretchable substrate 110a, and specifically the elastic structure 125, the stretchable substrate 110a, and the non-stretchable pattern 110b may be sequentially stacked along the thickness direction (e.g., Z direction) of the stretchable substrate 110a.

This may be formed by, for example, coating or depositing a second elastomer having a third elastic modulus on a rigid supporting plate such as a glass substrate to form a layer, patterning the layer to be selectively disposed at the boundary 1000B of the non-stretchable region 1000-1 and the stretchable region 1000-2 to form the elastic structure 125, then coating or depositing a first elastomer having a first elastic modulus to form the stretchable substrate 110a, and removing the supporting plate.

The stretchable panel 1000 according to some example embodiments, including example embodiments shown in at least FIG. 11 has a structure in which the elastic structure 125 having a medium elastic modulus (third elastic modulus), the stretchable substrate 110a having a low elastic modulus (first elastic modulus), and the non-stretchable pattern 110b having a high elastic modulus (second elastic modulus) are sequentially stacked, thereby lowering an average elastic modulus along the thickness direction (e.g., Z direction) of the stretchable substrate 110a to effectively disperse concentration of stress during stretching as described above.

In some example embodiments, the stretchable panel 1000 may include a stretchable substrate 110a; a non-stretchable pattern 110b having an edge portion 110b-E; a pixel circuit 120 including a first pixel circuit 120a and a second pixel circuit 120b; a unit element 130; a connection electrode 140; and an elastic structure 125, as in some example embodiments, including example embodiments shown in at least FIG. 11, but where, unlike some example embodiments, including example embodiments shown in at least FIG. 11, the elastic structure 125 is selectively disposed at (e.g., overlapping along the thickness direction of the stretchable substrate 110a) the boundary 10001B of the non-stretchable region 1000-1 and the stretchable region 1000-2 at least partially above the stretchable substrate 110a while the top surface of the elastic structure 125 is coplanar or substantially coplanar with the top surface of the stretchable substrate 110a.

Figure 12:
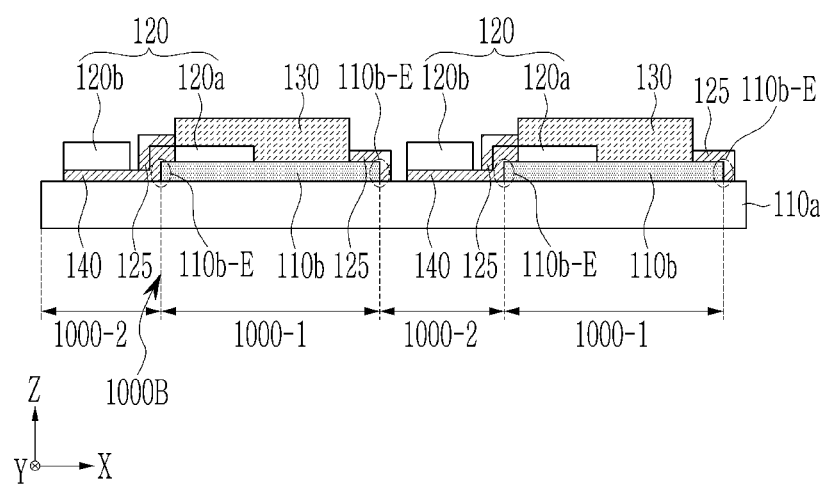
FIG. 12 is a cross-sectional view according to some example embodiments of the stretchable panel along cross-sectional view line IX-IX' of FIG. 8 according to some example embodiments.

FIG. 12 is a cross-sectional view according to another example of the stretchable panel along cross-sectional view line IX-IX' of FIG. 8 according to some example embodiments.

Referring to FIG. 12, the stretchable panel 1000 according to some example embodiments includes a stretchable substrate 110a; a non-stretchable pattern 110b having an edge portion 110b-E; a pixel circuit 120 including a first pixel circuit 120a and a second pixel circuit 120b; a unit element 130; a connection electrode 140; and an elastic structure 125, as in some example embodiments, including example embodiments shown in at least FIG. 3. Descriptions of the stretchable substrate 110a, the non-stretchable pattern 110b, the pixel circuit 120, the unit element 130, and the connection electrode 140 are the same as described above.

However, unlike some example embodiments, including example embodiments shown in at least FIG. 3, the elastic structure 125 of some example embodiments, including example embodiments shown in at least FIG. 12, is selectively disposed at (e.g., overlapping along the thickness direction of the stretchable substrate 110a) the boundary 1000B of the non-stretchable region 1000-1 and the stretchable region 1000-2 on the non-stretchable pattern 110b, and specifically the stretchable substrate 110a, the non-stretchable pattern 110b, and the elastic structure 125 may be sequentially stacked along the thickness direction (e.g., Z direction) of the stretchable substrate 110a.

The stretchable panel 1000 according to some example embodiments, including example embodiments shown in at least FIG. 12 has a structure in which a stretchable substrate 110a having a low elastic modulus (first elastic modulus), a non-stretchable pattern 110b having a high elastic modulus (second elastic modulus), and the elastic structure 125 having an intermediate elastic modulus (third elastic modulus) are sequentially stacked, thereby lowering an average elastic modulus along the thickness direction (e.g., Z direction) of the stretchable substrate 110a to effectively disperse concentration of stress during stretching as described above.

As described above, the elastic structure 125 is disposed in various positions and shapes according to the purpose and target of the application of the stretchable panel 1000 to reduce stress at the boundary 1000B of the stretchable region 1000-2 and the non-stretchable region 1000-1 during stretching of the stretchable panel 1000 to effectively disperse concentration of stress at the boundary 10001B of the stretchable region 1000-2 and the non-stretchable region 1000-1 during stretching, to reduce a short circuit and/or damage to the connection electrode 140, and to increase stretch stability of the stretchable panel 1000 and thus to improve performance and/or reliability of the stretchable panel 1000.

The aforementioned stretchable panel 1000 may be applied to various fields requiring flexibility and/or stretchability, and may be, for example, a stretchable display panel or a stretchable sensor array. The stretchable panel 1000 may be, for example, a bendable display panel, a foldable display panel, a rollable display panel, a wearable device, a skin-type stretchable display panel, a skin-like display panel, a skin-like sensor array, a large-area conformable display, smart clothing, or the like, but is not limited thereto.

Figure 13:
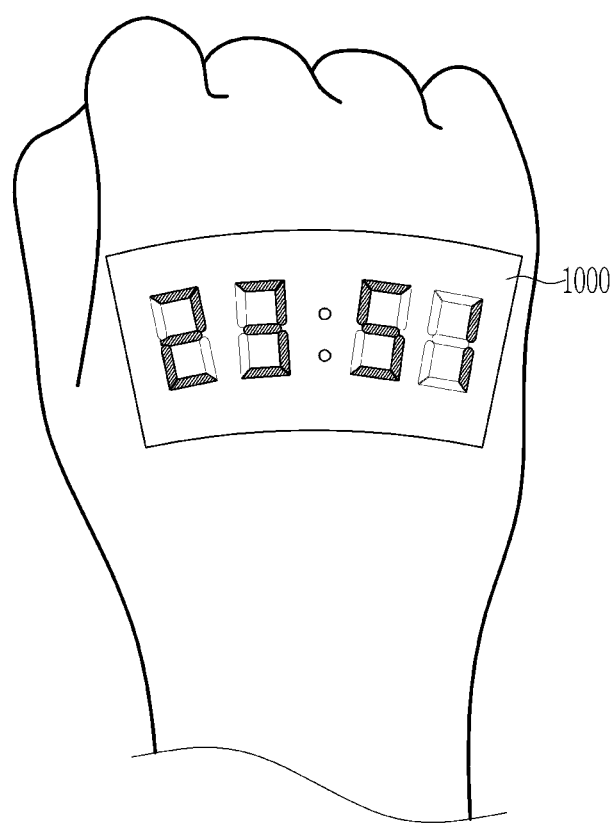
FIG. 13 is a schematic view showing a skin-type stretchable display panel according to some example embodiments.

FIG. 13 is a schematic view showing a skin-type stretchable display panel according to some example embodiments.

Referring to FIG. 13, the aforementioned stretchable panel 1000 may be a skin-type display panel that is an ultra-thin display panel, and may be configured to display particular (or, alternatively, predetermined) information such as various characters and/or images.

FIGS. 14, 15, 16, and 17 are schematic views each showing examples of stretchable display panels according to some example embodiments.

The stretchable display panel 2000 according to some example embodiments may be a display panel configured to be flexibly deformed by a user or an external force by introducing a structurally deformable portion into a screen for displaying an image. Herein, the structurally deformable portion may be at least a portion inside the screen.

Figure 14:
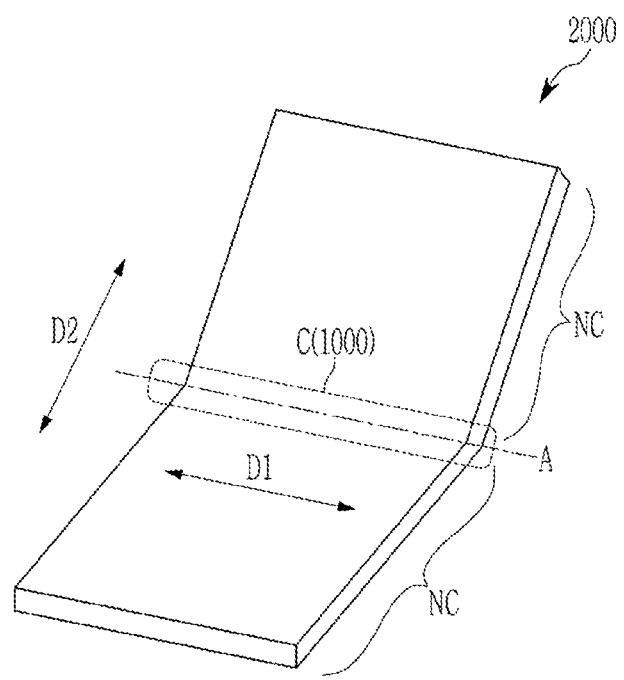
FIGS. 14, 15, 16, and 17 are schematic views each showing examples of stretchable display panels according to some example embodiments.
Figure 15:
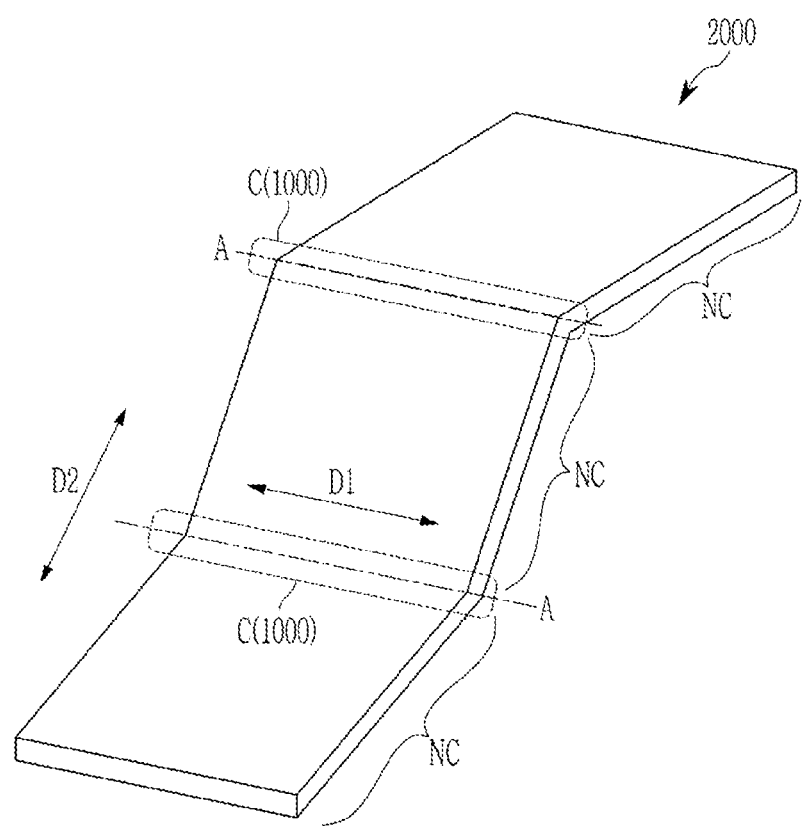

Referring to FIGS. 14 and 15, the stretchable display panel 2000 according to some example embodiments may be a foldable display panel of which a screen may be folded into one or more along a particular (or, alternatively, predetermined) direction. The foldable display panel shown in FIG. 14 is a one-axis foldable display panel of which a screen may be folded along one axis (A), and the foldable display panel 2000 shown in FIG. 15 is a multi-axis foldable display panel of which a screen may be folded along two axes (A). However, the present inventive concepts are not limited thereto, but the number of axis (A) may be three or more. FIG. 14 illustrates an example of an in-folding method in which the screen is folded inward, but the present example embodiments are not limited thereto but may be similarly applied to an out-folding method in which the screen is folded outward.

Figure 16:
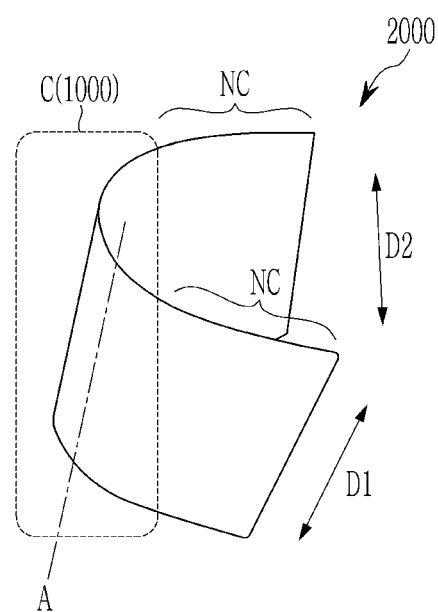
Figure 17:
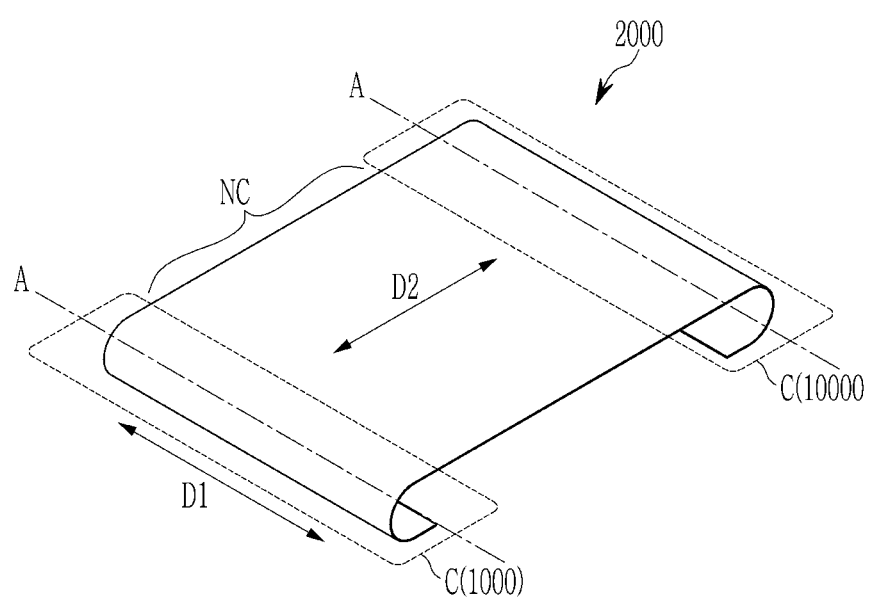

Referring to FIG. 16, the stretchable display panel 2000 according to some example embodiments may be a bendable display panel capable of bending a screen along a particular (or, alternatively, predetermined) direction. Referring to FIG. 17, the stretchable display panel 2000 according to some example embodiments may be a rollable display panel capable of rolling the screen along a particular (or, alternatively, predetermined) direction.

Referring to FIGS. 14 to 17, the stretchable display panel 2000 may be folded, bent, or rolled along at least one axis A extending the first direction D1. The stretchable display panel 2000 may include a deformable section C that is foldable, bendable, or rollable along the axis A and a non-deformable section NC excluding the deformable section C.

The deformable section C may be a foldable section, a bendable section, or a rollable section which is deformable into a curve around the axis A, wherein one or more axis A may be included in the stretchable display panel 2000. The deformable section C may be a region where a radius of curvature, which refers to a degree of being folded, bent, or rolled up to a maximum without substantial damage, is defined and where stress is concentrated, when repetitively folded, bent, or rolled. The stress may act on the deformable section C in a direction of being repetitively folded, bent, or rolled, for example, in a second direction D2 substantially perpendicular to the first direction D1. The non-deformable section NC may be a flat section or have relatively smaller stress than the deformable section C, but the present inventive concepts are not limited thereto.

The deformable section C of the stretchable display panel 2000 may include the stretchable panel 1000 illustrated in any one of FIGS. 1 to 12, and as described above, the non-stretchable region 1000-1 and the stretchable region 1000-2 may be included. The deformable section C of the stretchable display panel 2000 includes a stretchable substrate 110a; a non-stretchable pattern 110b having an edge portion 110b-E; a pixel circuit 120 including a first pixel circuit 120a and a second pixel circuit 120b; a unit element 130; a connection electrode 140; and an elastic structure 125, as in some example embodiments, including example embodiments shown in any one of FIGS. 1 to 12. Descriptions of the stretchable substrate 110a, the non-stretchable pattern 110b, the pixel circuit 120, the unit element 130, and the connection electrode 140 are the same as described above. For example, the first pixel circuit 120a may be disposed in the non-stretchable region 1000-1, and the second pixel circuit 120b may be disposed in the stretchable region 1000-2.

The stretchable region 1000-2 is a region capable of flexibly responding to an external force such as twisting, pressing, and/or pulling and may include, as described above, a first elastomer having a relatively low first elastic modulus, and accordingly, may provide the deformable section C of the stretchable display panel 2000 with stretchability to reduce stress acting when repetitively folded, bent, or rolled, and thus prevent or reduce damage in the deformable section C.

The non-stretchable region 1000-1 is a region that is not substantially deformed or very slightly deformed due to relatively high resistance to the external force such as twisting, pressing, and/or pulling, and may include a particular material including an organic material, an inorganic material, an organic/inorganic material, or a combination thereof, where the particular material has a relatively high second elastic modulus, as described above. As described above, at least a portion of the pixel circuit 120 may be disposed in the stretchable region 1000-2, and the other portion (e.g., another portion) of the pixel circuit 120 and the unit element 130 may be disposed in the non-stretchable region 1000-1.

The deformable section C of the stretchable display panel 2000, as described above, may be formed by disposing at least a portion of the pixel circuit 120 (e.g., at least a portion of a thin film transistor) in the stretchable region 1000-2 to overcome spatial limitation for pixel arrangement due to the stretchable region 1000-2 but increase the number of pixels per unit area. For example, in the deformable section C, the number of pixels per unit area may be greater than or equal to about 150 ppi (pixel per inch), greater than or equal to about 200 ppi, greater than or equal to about 250 ppi, greater than or equal to about 300 ppi, greater than or equal to about 350 ppi, greater than or equal to about 400 ppi, greater than or equal to about 450 ppi, or greater than or equal to about 500 ppi, for example, about 150 ppi to about 1000 ppi, about 200 ppi to about 1000 ppi, about 250 ppi to about 1000 ppi, about 300 ppi to about 1000 ppi, about 350 ppi to about 1000 ppi, about 400 ppi to about 1000 ppi, about 450 ppi to about 1000 ppi, or about 500 ppi to about 1000 ppi. Accordingly, the deformable section C of the stretchable display panel 2000 may realize substantially the same resolution in the non-deformable section NC, and resultantly, uniform display quality over the entire screen may be achieved without deteriorating image quality in the deformable section C such as a foldable section, a bendable section, or a rollable section, thereby improving performance and/or reliability of the stretchable display panel 2000.

In addition, in the deformable section C of the stretchable display panel 2000, by disposing the elastic structure 125 having an elastic modulus between the elastic modulus of the stretchable region 1000-2 and the elastic modulus of the non-stretchable region 1000-1 at the boundary of the non-stretchable region 1000-1 and the stretchable region 1000-2 of the stretchable panel 1000, an abrupt change in the elastic modulus between the non-stretchable region 1000-1 and the stretchable region 1000-2 may be alleviated or prevented and by gradually changing the elastic modulus such as a low elastic modulus (first elastic modulus), a medium elastic modulus (third elastic modulus), and a high elastic modulus (second elastic modulus) along the thickness direction (e.g., Z direction) of the stretchable substrate 110a, concentration of stress caused by stretching at the boundary of the non-stretchable region 1000-1 and the stretchable region 1000-2 may be alleviated, reduced, minimized, or prevented, and thus disconnection and/or damage to the connection electrode 140 at the boundary of the non-stretchable region 1000-1 and the stretchable region 1000-2 may be effectively prevented, thereby improving stretching stability, and thus performance and/or reliability, of the stretchable display panel 2000.

Unlike the deformable section C, the non-deformable section NC of the stretchable display panel 2000 may not include (e.g., may exclude) a separate stretchable region 1000-2 and may consist of the non-stretchable region 1000-1. Accordingly, the non-deformable section NC of the stretchable display panel 2000 may be covered with the non-stretchable pattern 110b on the stretchable substrate 110a, and the whole non-deformable section NC may be covered with, for example, a plate-shaped non-stretchable pattern 110b.

As described above, the stretchable display panel 2000 according to some example embodiments is manufactured, as described above, by disposing the stretchable region 1000-2 in the deformable section C such as a foldable section, a bendable section, or a rollable section and including the elastic structure 125 present over the stretchable region 1000-2 and the non-stretchable region 1000-1 to effectively reduce stress applied when repetitively folded, bent, or rolled, and thus prevent, minimize, or reduce damage in the deformable section C. In addition, this reduction of the stress applied in the deformable section C may realize a foldable, bendable, or rollable display panel with a small curvature, for example, less than or equal to about 1 mm, less than or equal to about 0.8 mm, less than or equal to about 0.5 mm, less than or equal to about 0.3 mm, less than or equal to about 0.2 mm, or less than or equal to about 0.1 mm, and/or greater than about 0.01 mm, greater than about 0.05 mm, greater than about 0.1 mm, or the like.

Figure 18A:
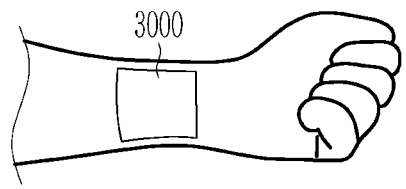
FIGS. 18A, 18B, and 18C are schematic views illustrating examples of skin-type sensor arrays according to some example embodiments.
Figure 18B:
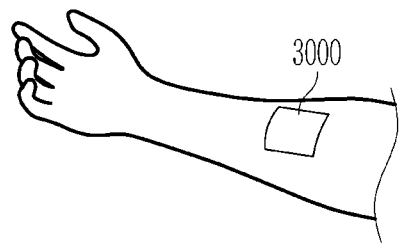
Figure 18C:
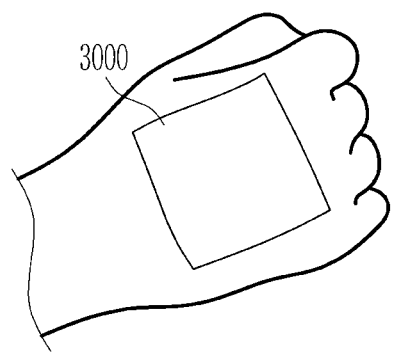

FIGS. 18A, 18B, and 18C are schematic views illustrating examples of the biometric sensor arrays according to some example embodiments.

Referring to FIGS. 18A to 18C, the biometric sensor array 3000 according to some example embodiments may be an attachable biometric sensor array, and may include the aforementioned stretchable panel 1000. The biometric sensor array 3000 may be attached to a biological surface such as skin, a living body such as an organ, or an indirect means contacting a living body such as clothes to sense and measure biological information such as a biological signal. For example, the biometric sensor array 3000 includes an electroencephalogram (EEG) sensor, an electrocardiogram (ECG) sensor, a blood pressure (BP) sensor, an electromyography (EMG) sensor, a blood glucose (BG) sensor, a photoplethysmography (PPG) sensor, an accelerometer, a RFID antenna, an inertial sensor, an activity sensor, a strain sensor, a motion sensor, or a combination thereof, but is not limited thereto. The biometric sensor array 3000 may be attached to a living body in a very thin patch type or band type to monitor biometric information in real time. For example, the biometric sensor array 3000 may be a sensor array including a photoplethysmography sensor (PPG sensor), and the biometric information may include heart rate, oxygen saturation, stress, arrhythmia, blood pressure, etc., and biometric information may be obtained by analyzing the waveform of an electrical signal.

The aforementioned stretchable panel 1000 and the stretchable display panel 2000 or the biometric sensor array 3000 including the stretchable panel 1000 may be included in various electronic devices, and the electronic device may further include a processor (not shown) and a memory (not shown).

The electronic devices may include, for example, mobile phones, video phones, smart phones, smart pads, smart watches, digital cameras, tablet PCs, laptop PCs, notebook computers, computer monitors, wearable computers, televisions, digital broadcasting terminals, e-books, and personal digital assistants (PDAs), PMP (portable multimedia player), EDA (enterprise digital assistant), head mounted displays (HMD), in-vehicle navigations, Internet of Things (IoT), Internet of Everything (IoE), security devices, medical devices, but are not limited thereto.

Hereinafter, some example embodiments are illustrated in more detail with reference to examples. However, the present scope of the inventive concepts is not limited to these examples.

Evaluation I

Reference Example 1

In the stretchable panel shown in FIG. 3, a structure including a stretchable substrate (elastic modulus: about 10 MPa) made of styrene-ethylene-butylene-styrene (SEBS) without an elastic structure and a non-stretchable pattern made of polyimide (elastic modulus: about 10 GPa) is set and a strain-stress evaluation between the non-stretchable region and the stretchable region is performed.

Example 1

In the stretchable panel shown in FIG. 3, a structure including a stretchable substrate (elastic modulus: about 10 MPa) made of styrene-ethylene-butylene-styrene (SEBS), an elastic structure made of styrene-ethylene-butylene-styrene (SEBS) (elastic modulus: about 30 MPa), and a non-stretchable pattern (elastic modulus: about 10 GPa) made of polyimide is set and a strain-stress evaluation between the non-stretchable region and the stretchable region is performed.

The strain-stress evaluation is performed by calculating a strain distribution through a Finite Element Analysis by using a COMSOL Multiphysics Software. Specifically, when a strain acts in the X-axis direction, a length of the non-stretchable pattern in the X-axis direction is ½ of that of the stretchable substrate in the x-axis direction, and a length of the elastic structure in the X-axis direction is 10 μm longer than that of the non-stretchable pattern. When a strain of the stretchable panel becomes about 10% by applying external stress, a maximum strain of the stretchable substrate around the non-stretchable pattern is evaluated.

The results are shown in Table 1.

TABLE 1

| | Maximum strain (%) |
|---|---|
| Reference Example 1 | 40 |
| Example 1 | 26 |

Referring to Table 1, the maximum strain acting on the stretchable panel with no elastic structure according to Reference Example 1 is about 40%, which is about 4 times higher than the external strain of 10%. On the contrary, the maximum strain acting on the stretchable panel with an elastic structure according to Example 1 is about 26%, which is reduced by about 30% or more, compared with the maximum strain of the stretchable panel according to Reference Example 1.

Evaluation II

Reference Example 2

In the stretchable panel shown in FIG. 5, a structure including a stretchable substrate (elastic modulus: about 10 MPa) made of styrene-ethylene-butylene-styrene (SEBS) without an elastic structure and a non-stretchable pattern made of polyimide (elastic modulus: about 10 GPa) is set and a strain-stress evaluation between the non-stretchable region and the stretchable region is performed.

Example 2

In the stretchable panel shown in FIG. 5, a structure including a stretchable substrate (elastic modulus: about 10 MPa) made of styrene-ethylene-butylene-styrene (SEBS), an elastic structure made of styrene-ethylene-butylene-styrene (SEBS) (elastic modulus: about 30 MPa), and a non-stretchable pattern (elastic modulus: about 10 GPa) made of polyimide is set and a strain-stress evaluation between the non-stretchable region and the stretchable region is performed.

The results are shown in Table 2.

TABLE 2

| | Maximum strain (%) |
|---|---|
| Reference Example 2 | 40 |
| Example 2 | 32 |

Referring to Table 2, the maximum strain of the stretchable panel with no elastic structure according to Reference Example 2 is about 40%, which is about 4 times higher than the external strain of 10%. On the contrary, the maximum strain acting on the stretchable panel with the elastic structure according to Example 2 is about 32%, which is reduced by about 20% or more, compared with the maximum strain acting on the stretchable panel according to Reference Example 2.

Evaluation III

Reference Example 3

In the stretchable panel shown in FIG. 6, a structure including a stretchable substrate (elastic modulus: about 10 MPa) made of styrene-ethylene-butylene-styrene (SEBS) without an elastic structure and a non-stretchable pattern made of polyimide (elastic modulus: about 10 GPa) is set and a strain-stress evaluation between the non-stretchable region and the stretchable region is performed.

Example 3

In the stretchable panel shown in FIG. 6, a structure including a stretchable substrate (elastic modulus: about 10 MPa) made of styrene-ethylene-butylene-styrene (SEBS), an elastic structure made of styrene-ethylene-butylene-styrene (SEBS) (elastic modulus: about 50 MPa), and a non-stretchable pattern (elastic modulus: about 10 GPa) made of polyimide is set and a strain-stress evaluation between the non-stretchable region and the stretchable region is performed.

The results are shown in Table 3.

TABLE 3

|  | Maximum strain (%) |
| --- | --- |
| Reference Example 3 | 40 |
| Example 3 | 32 |

Referring to Table 3, the maximum strain acting on the stretchable panel with no elastic structure according to Reference Example 3 is about 40%, which is 4 times higher than the external strain of 10%. On the contrary, the maximum strain acting on the stretchable panel including the elastic structure according to Example 3 is about 32%, which is reduced by about 20% or more, compared with the maximum strain acting on the stretchable panel according to Reference Example 3.

Evaluation IV

Reference Example 4

In the stretchable panel shown in FIG. 7, a structure including a stretchable substrate (elastic modulus: about 10 MPa) made of styrene-ethylene-butylene-styrene (SEBS) without an elastic structure and a non-stretchable pattern made of polyimide (elastic modulus: about 10 GPa) is set and a strain-stress evaluation between the non-stretchable region and the stretchable region is performed.

Example 4

In the stretchable panel shown in FIG. 7, a structure including a stretchable substrate (elastic modulus: about 10 MPa) made of styrene-ethylene-butylene-styrene (SEBS), an elastic structure made of styrene-ethylene-butylene-styrene (SEBS) (elastic modulus: about 30 MPa), and a non-stretchable pattern (elastic modulus: about 10 GPa) made of polyimide is set and a strain-stress evaluation between the non-stretchable region and the stretchable region is performed.

The results are shown in Table 4.

TABLE 4

|  | Maximum strain (%) |
| --- | --- |
| Reference Example 4 | 40 |
| Example 4 | 35 |

Referring to Table 4, the maximum strain acting on the stretchable panel with no elastic structure according to Reference Example 4 is about 40%, which is about 4 times higher than the strain of 10%. On the contrary, the maximum strain acting on the stretchable panel including the elastic structure according to Example 4 is about 35%, which is reduced by about 12% or more, compared with the maximum strain acting on the stretchable panel according to Reference Example 4.

Referring to Tables 1 to 4, the stretchable panels including the elastic structure according to Examples have relatively low stress at the boundary of stretchable region and non-stretchable region, compared with the stretchable panels including no elastic structure according to Reference Examples.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. A stretchable panel, comprising:
   a stretchable substrate, the stretchable substrate including a first elastomer having a first elastic modulus,
   a non-stretchable pattern covering a portion of the stretchable substrate, the non-stretchable pattern including a particular material that includes an organic, inorganic, or organic-inorganic material, the particular material having a second elastic modulus higher than the first elastic modulus,
   a plurality of unit elements on the non-stretchable pattern,
   a plurality of pixel circuits configured to independently operate separate, respective unit elements of the plurality of unit elements,
   a connection electrode configured to electrically connect the plurality of unit elements and separate, respective pixel circuits of the plurality of pixel circuits, and
   an elastic structure overlapped with an edge portion of the non-stretchable pattern along a thickness direction of the stretchable substrate, the elastic structure including a second elastomer having a third elastic modulus higher than the first elastic modulus and lower than the second elastic modulus, wherein
   the stretchable panel includes
      a non-stretchable region in which the stretchable substrate and the non-stretchable pattern are overlapped along the thickness direction of the stretchable substrate,
      a stretchable region excluding the non-stretchable region, and
      at least a portion of the elastic structure is in the stretchable region, and at least a portion of the plurality of pixel circuits is in the stretchable region.

2. The stretchable panel of claim 1, wherein
   each pixel circuit of the plurality of pixel circuits is configured to operate a separate unit element of the plurality of unit elements and comprises a first pixel circuit and a second pixel circuit,
   the first pixel circuit is in the non-stretchable region,
   the second pixel circuit is in the stretchable region, and
   the connection electrode is configured to
      electrically connect the first pixel circuit of a separate pixel circuit of the plurality of pixel circuits and the second pixel circuit of the separate pixel circuit, or
      electrically connect the separate unit element of the plurality of unit elements and the second pixel circuit of the separate pixel circuit.

3. The stretchable panel of claim 2, wherein
   the first pixel circuit comprises a non-stretchable thin film transistor, a capacitor, or a combination thereof, and
   the second pixel circuit comprises a stretchable thin film transistor.

4. The stretchable panel of claim 2, wherein
   the first pixel circuit comprises a driving thin film transistor, and
   the second pixel circuit comprises a switching thin film transistor.

5. The stretchable panel of claim 1, wherein the connection electrode is overlapped with the edge portion of the non-stretchable pattern and the elastic structure along the thickness direction of the stretchable substrate, respectively.

6. The stretchable panel of claim 1, wherein the elastic structure is
under the stretchable substrate,
inside the stretchable substrate,
on the non-stretchable pattern, or
between the stretchable substrate and the non-stretchable pattern.

7. The stretchable panel of claim 1, wherein
the elastic structure is overlapped with at least one unit element of the plurality of unit elements along the thickness direction of the stretchable substrate, and
a dimension of the elastic structure is greater than a dimension of the at least one unit element.

8. The stretchable panel of claim 1, wherein each unit element of the plurality of unit elements comprises a light emitting diode, a photoelectric conversion diode, or a combination thereof.

9. The stretchable panel of claim 1, wherein the non-stretchable pattern comprises
a plurality of island-shaped non-stretchable patterns repeatedly arranged on the stretchable substrate and on which the plurality of unit elements are disposed, and
a plurality of linear non-stretchable patterns connecting between adjacent island-shaped non-stretchable patterns of the plurality of island-shaped non-stretchable patterns.

10. The stretchable panel of claim 9, further comprising a wire electrically connected to at least one pixel circuit of the plurality of pixel circuits or at least one unit element of the plurality of unit elements,
wherein the wire is on the plurality of linear non-stretchable patterns.

11. A stretchable panel that is foldable, bendable, or rollable along at least one axis extending in a first direction, the stretchable panel comprising:
a deformable section that is foldable, bendable, or rollable along the at least one axis extending in the first direction, and
a non-deformable section excluding the deformable section,
wherein the deformable section includes
a stretchable substrate comprising a first elastomer having a first elastic modulus,
a non-stretchable pattern covering a portion of the stretchable substrate, the non-stretchable pattern comprising a particular material that includes an organic, inorganic, or organic-inorganic material, the particular material having a second elastic modulus higher than the first elastic modulus,
a plurality of unit elements arranged on the non-stretchable pattern,
a plurality of pixel circuits configured to independently operate separate, respective unit elements of the plurality of unit elements,
a connection electrode configured to electrically connect each unit element of the plurality of unit elements and each pixel electrode of the plurality of pixel circuits, and
an elastic structure overlapped with an edge portion of the non-stretchable pattern along a thickness direction of the stretchable substrate, the elastic structure including a second elastomer having a third elastic modulus higher than the first elastic modulus and lower than the second elastic modulus, wherein
the deformable section of the stretchable panel includes
a non-stretchable region in which the stretchable substrate and the non-stretchable pattern are overlapped along the thickness direction of the stretchable substrate,
a stretchable region excluding the non-stretchable region, and
at least a portion of the elastic structure is in the stretchable region, and
a portion of the plurality of pixel circuits is on the stretchable region.

12. The stretchable panel of claim 11, wherein
each pixel circuit of the plurality of pixel circuits is configured to operate a separate unit element of the plurality of unit elements,
each pixel circuit of the plurality of pixel circuits comprises
a first pixel circuit in the non-stretchable region, the first pixel circuit comprising a non-stretchable thin film transistor, a capacitor, or a combination thereof; and
a second pixel circuit in the stretchable region, the second pixel circuit comprising a stretchable thin film transistor,
wherein each unit element of the plurality of unit elements comprises a light emitting diode, a photoelectric conversion diode, or a combination thereof.

13. The stretchable panel of claim 11, wherein the elastic structure is
under the stretchable substrate,
inside the stretchable substrate
on the non-stretchable pattern, or
between the stretchable substrate and the non-stretchable pattern.

14. The stretchable panel of claim 11, wherein
the non-stretchable pattern comprises
a plurality of island-shaped non-stretchable patterns which are repeatedly disposed on the stretchable substrate in the deformable section and on which the plurality of unit elements are disposed,
a plurality of linear non-stretchable patterns which connect between adjacent island-shaped non-stretchable patterns of the plurality of island-shaped non-stretchable patterns in the deformable section and on which wires electrically connected to the plurality of pixel circuits or the plurality of unit elements are disposed, and
a plate-shaped non-stretchable pattern located entirely within the non-deformable section.

15. A stretchable panel, comprising:
a plurality of unit elements including a light emitting diode, a photoelectric conversion diode, or a combination thereof,
a switching thin film transistor and a driving thin film transistor configured to independently operate each unit element of the plurality of unit elements,
a plurality of island-shaped non-stretchable patterns, the plurality of island-shaped non-stretchable patterns supporting each unit element of the plurality of unit elements,
a plurality of linear non-stretchable patterns connecting between adjacent island-shaped non-stretchable patterns of the plurality of island-shaped non-stretchable patterns and on which wires electrically connected to the plurality of unit elements are located,
a stretchable substrate supporting the plurality of island-shaped non-stretchable patterns and the plurality of linear non-stretchable patterns, and an elastic structure disposed on, under, or inside the stretchable substrate and overlapped with an edge portion of the plurality of island-shaped non-stretchable patterns along a thickness direction of the stretchable substrate, wherein the stretchable substrate includes a first elastomer having a first elastic modulus, wherein the plurality of island-shaped non-stretchable patterns include a particular material that includes an organic material, an inorganic material, an organic-inorganic material, or a combination thereof, the particular material having a second elastic modulus higher than the first elastic modulus, and the elastic structure includes a second elastomer having a third elastic modulus higher than the first elastic modulus and lower than the second elastic modulus.

16. The stretchable panel of claim 15, wherein
the stretchable panel includes
a non-stretchable region in which the stretchable substrate is overlapped with the plurality of island-shaped non-stretchable patterns or the plurality of linear non-stretchable patterns along the thickness direction of the stretchable substrate, and
a stretchable region excluding the non-stretchable region, and
at least a portion of the switching thin film transistor and the driving thin film transistor is in the stretchable region.

17. The stretchable panel of claim 16, wherein
one of the switching thin film transistor or the driving thin film transistor is in the stretchable region,
another one of the switching thin film transistor or the driving thin film transistor is in the non-stretchable region,
the stretchable panel further comprises a connection electrode electrically connecting the switching thin film transistor and the driving thin film transistor, and
the connection electrode is overlapped with the edge portion of the plurality of island-shaped non-stretchable patterns and the elastic structure along the thickness direction of the stretchable substrate, respectively.

18. An electronic device comprising the stretchable panel according to claim 1.

* * * * *